United States Patent
Kim

(10) Patent No.: US 11,630,721 B2
(45) Date of Patent: Apr. 18, 2023

(54) MEMORY SYSTEM AND OPERATING METHOD THEREOF

(71) Applicant: SK hynix Inc., Gyeonggi-do (KR)

(72) Inventor: Tae-Hoon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 214 days.

(21) Appl. No.: 16/867,660

(22) Filed: May 6, 2020

(65) Prior Publication Data

US 2020/0264948 A1    Aug. 20, 2020

Related U.S. Application Data

(63) Continuation of application No. 16/196,928, filed on Nov. 20, 2018, now Pat. No. 10,678,633, which is a continuation-in-part of application No. 15/826,857, filed on Nov. 30, 2017, now Pat. No. 10,417,082.

(30) Foreign Application Priority Data

Mar. 3, 2017 (KR) .................. 10-2017-0027615

(51) Int. Cl.
| | | |
|---|---|---|
| G11C 16/10 | (2006.01) | |
| G06F 11/10 | (2006.01) | |
| G06F 11/14 | (2006.01) | |
| G06F 11/16 | (2006.01) | |
| H03M 13/09 | (2006.01) | |

(52) U.S. Cl.
CPC ...... G06F 11/1004 (2013.01); G06F 11/1048 (2013.01); G06F 11/1443 (2013.01); G06F 11/1625 (2013.01); H03M 13/09 (2013.01)

(58) Field of Classification Search
CPC .. G11C 11/00; G06F 11/1004; G06F 11/1048; G06F 11/1443; G06F 11/1625
USPC ........................... 365/185.01–185.33
See application file for complete search history.

(56) References Cited

U.S. PATENT DOCUMENTS

| | | | | |
|---|---|---|---|---|
| 8,259,497 | B2* | 9/2012 | Shalvi | G11C 11/56 |
| | | | | 365/185.09 |
| 9,490,015 | B2* | 11/2016 | Ahn | G11C 16/10 |
| 2002/0054508 | A1* | 5/2002 | Nozoe | G06F 11/1068 |
| | | | | 365/185.09 |
| 2003/0117846 | A1* | 6/2003 | Hasegawa | G11C 16/102 |
| | | | | 365/185.09 |
| 2003/0156453 | A1* | 8/2003 | Pochmuller | G11C 7/24 |
| | | | | 365/185.09 |
| 2008/0123419 | A1* | 5/2008 | Brandman | G11C 11/5642 |
| | | | | 365/185.09 |
| 2008/0123420 | A1* | 5/2008 | Brandman | G11C 11/5642 |
| | | | | 365/185.09 |
| 2009/0196101 | A1* | 8/2009 | Abe | G11C 29/74 |
| | | | | 365/185.09 |
| 2009/0310408 | A1* | 12/2009 | Lee | G11C 16/3431 |
| | | | | 365/185.03 |
| 2009/0313533 | A1* | 12/2009 | Bains | G06F 11/1004 |
| | | | | 714/E11.032 |

(Continued)

*Primary Examiner* — Xiaochun L Chen
(74) *Attorney, Agent, or Firm* — IP & T Group LLP

(57) ABSTRACT

A memory system includes a controller configured to transfer first data for a program operation, and a memory device configured to perform an error check operation for determining whether second data received from the controller are equal to the first data and the program operation for storing the first data.

20 Claims, 13 Drawing Sheets

FIG.9

(56) References Cited

U.S. PATENT DOCUMENTS

| | | | |
|---|---|---|---|
| 2009/0316483 A1* | 12/2009 | Kim | G11C 16/349 365/185.09 |
| 2010/0195393 A1* | 8/2010 | Eggleston | G06F 11/106 365/185.09 |
| 2010/0202203 A1* | 8/2010 | Choi | G06F 11/1068 365/185.09 |
| 2014/0149833 A1* | 5/2014 | Sauber | H03M 13/095 714/807 |
| 2016/0012895 A1* | 1/2016 | Ahn | G11C 16/10 365/185.03 |
| 2016/0034349 A1* | 2/2016 | Choi | G11C 29/26 714/764 |

* cited by examiner

MEMORY SYSTEM AND OPERATING METHOD THEREOF

CROSS-REFERENCE TO RELATED APPLICATION

This application is a continuation of U.S. patent application Ser. No. 16/196,928 filed on Nov. 20, 2018, which is a continuation-in-part of U.S. patent application Ser. No. 15/826,857 filed on Nov. 30, 2017, and issued as U.S. Pat. No. 10,417,082 on Sep. 17, 2019, which claims benefits of priority of Korean Patent Application No, 10-2017-0027615 filed on Mar. 3, 2017. The disclosure of each of the foregoing application is incorporated herein by reference in its entirety.

TECHNICAL FIELD

Various embodiments relate to a memory system and, more particularly, to a memory system for processing data to and from a memory device, and an operating method thereof.

DISCUSSION OF THE RELATED ART

The computer environment paradigm has changed to ubiquitous computing systems that can be used anytime and anywhere. Due to this fact, use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption because they have no moving parts. Examples of memory systems having such advantages include universal serial bus (USB) memory devices, memory cards having various interfaces, and solid state drives (SSD).

SUMMARY

Various embodiments of the present invention are directed to a memory system exhibiting improved reliability and performance compared to existing memory systems.

Various embodiments of the present invention are directed to a memory system r exhibiting reduced performance deterioration.

Various embodiments of the present invention are directed to a memory system increasing the use efficiency of a memory device contained in the memory system.

Various embodiments of the present invention are directed to an operating method for the memory system.

In an embodiment, a memory system may include: a controller configured to transfer first data for a program operation; and a memory device configured to perform an error check operation for determining whether second data received from the controller are equal to the first data and the program operation for storing the first data.

The memory device may perform the error check operation at the same time as the program operation, or performs the error check operation before/after the program operation.

The memory device may complete the error check operation before the program operation is completed.

When the result of the error check operation indicates that the first and second data are not equal to each other, the controller may retransfer the first data.

The memory device may perform the error check operation on a data size basis by which the program operation is performed.

The controller may randomize the first data and transfer the randomized first data through the channel, and the memory device may perform the error check operation to check the ratio of 0's to 1's in cells on which the program operation for the first data has been performed, in order to determine whether the first and second data are equal to each other.

The memory device may check the ratio of 0's to 1's in the cells on a data size basis by which the program operation is performed.

The memory device may check the ratio of 0's to 1's in the cells in which data are stored during the program operation, based on a current applied to the cells.

In an embodiment, an operating method of a memory system may the steps of: transferring, by a controller, first data for a program operation; performing, by a memory device, an error check operation to determine whether second data received from the controller are equal to the first data; and performing, by the memory device, the program operation to store the first data.

The step of performing the program operation may be performed at the same time as the step of performing the error check operation or performed before/after the step of performing the error check operation.

The step of performing the error check operation may be completed before the step of performing the program operation.

The operating method may further include the step of retransferring, by the controller, the first data through the channel, when the result of the error check operation indicates that the first and second data are not equal to each other.

The step of performing the program operation may include stopping the program operation before the program operation is not completed, when the result of the error check operation indicates that the first and second data are not equal to each other.

The step of performing the error check operation may include performing the error check operation on a data size basis by which the program operation is performed.

The step of performing the error check operation may include performing the error check operation to check one or more of a parity bit, CRC bit and hash code bit for the first data, in order to determine whether the first and second data are equal to each other.

The step of transferring the first data may include transferring the randomized first data through the channel, and the step of performing the error check operation may include performing the error check operation to check the ratio of 0's to 1's in cells on which the program operation for the received data has been performed, in order to determine whether the first and second data are equal to each other.

The step of performing the error check operation may include checking the ratio of 0's to 1's in the cells on a data size basis by which the program operation is performed.

The step of performing the error check operation may include checking the ratio of 0's to 1's in the cells in which data are stored during the program operation, based on a current applied to the cells.

In an embodiment, A memory system may include a controller configured to transfer first data; and a memory device configured to: receive the first data transferred by the controller, perform a program operation on the first data, perform an error check operation to determine whether second data received from the controller is equal to the first data, and stop performing the program operation before it is completed when the result of the error check operation indicates that the first and second data are not equal to each other; wherein the controller is further configured to retransfer the first data to the memory device when the result of the error check operation indicates that the first and second data are not equal to each other.

DETAILED DESCRIPTION

Figure 1:
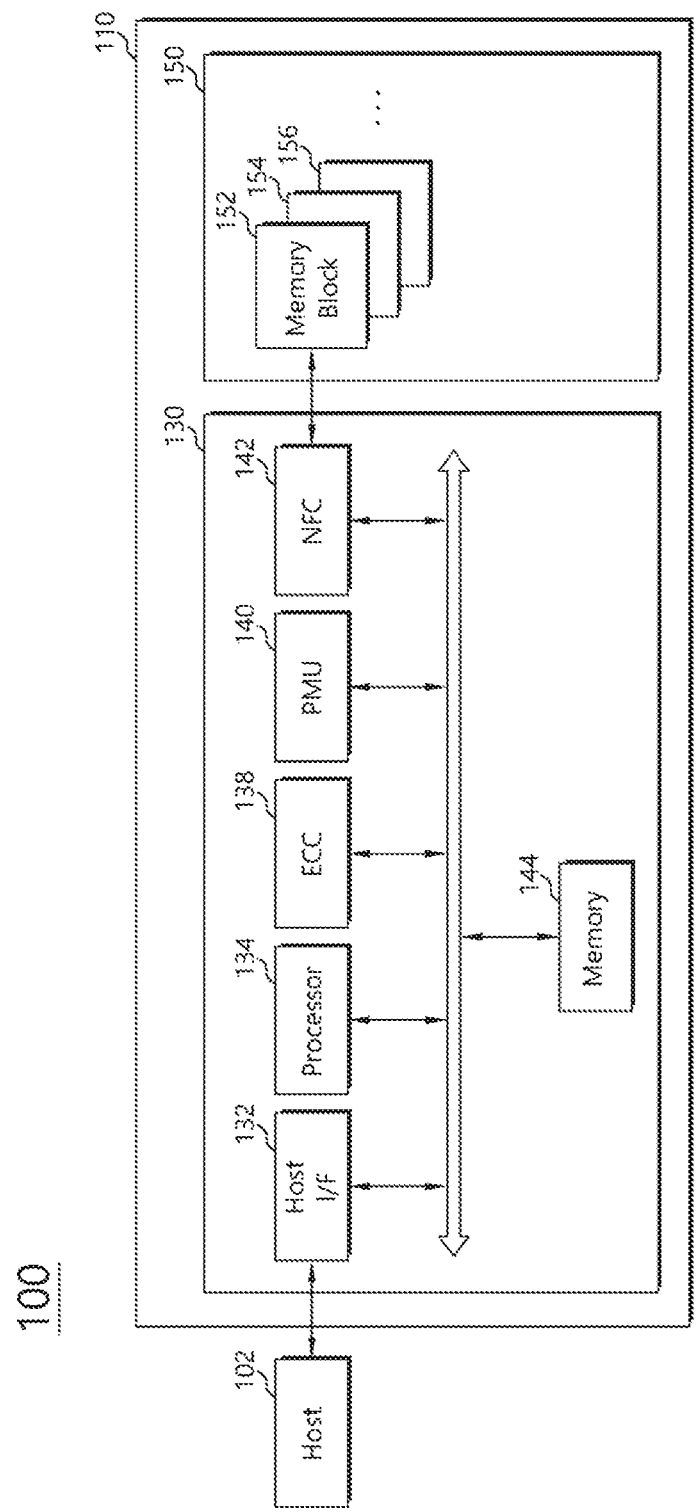
FIG. 1 is a block diagram illustrating a data processing system including a memory system in accordance with an embodiment of the present invention.

Various embodiments of the present invention are described below in more detail with reference to the accompanying drawings. However, the present invention may be embodied in different forms and variations thereof and should not be construed as being limited to the embodiments set forth herein. Rather, the described embodiments are provided so that this disclosure is thorough and complete and fully conveys the present invention to those skilled in the art to which this invention pertains. Throughout the disclosure, like reference numerals refer to like parts. Also, throughout the specification, reference to "an embodiment" or the like is not necessarily to only one embodiment, and different references to "an embodiment' or the like are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments and is not intended to limit the present invention. As used herein, singular forms are intended to include the plural forms and vice versa, unless the context clearly indicates otherwise. It will be further understood that the terms "comprises," "comprising," "includes," and "including" when used in this specification, specify the presence of the stated elements but do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention pertains in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may include a portable electronic device such as a mobile phone, MP3 player and laptop computer or a non-portable electronic device such as a desktop computer, game machine, TV and projector.

The host 102 may include at least one OS (operating system), and the OS may manage and control overall functions and operations of the host 102, and provide an operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. In an embodiment, the host 102 may include a plurality of OSs, and execute an OS to perform an operation corresponding to a user's request on the memory system 110.

The memory system 110 may store data for the host 102 in response to a request received from the host 102. Non-limiting examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC, and the SD card may include a mini-SD card and micro-SD card.

The memory system 110 may be embodied as any one of various types of storage devices including, for example, volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The memory system may have a 3-dimensioanl (3D) stack structure. In an embodiment, the memory system 110 may be implemented as a three-dimensional flash memory.

The memory system 110 may include a memory device 150 and a controller 130 operatively coupled to each other. The memory device 150 may store data for the host 120, and the controller 130 may controlthe storing of the data into the memory device 150. The controller 130 may also control the reading of the data from the memory device 150 and the transferring of the read data to the host.

The controller 130 and the memory device 150 may be integrated into a single semiconductor device, which may be implemented as any one of the various types of memory systems as exemplified above. For example, the controller 130 and the memory device 150 may be integrated as one semiconductor device to constitute an SSD. When the memory system 110 is used as an SSD, the operating speed of the host 102 connected to the memory system 110 can be improved.

Non-limiting application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied to the memory device. The memory device 150 may store data provided from the host 102 through a write operation, and provide data stored therein to the host 102 through a read operation. The memory device 150 may include a plurality of memory dies, each memory die including a plurality of planes, each plane including a plurality of memory blocks 152 to 156, each of which may include a plurality of pages, and each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) 132, a processor 134, an error correction code (ECC) component 138, a Power Management Unit (PMU) 140, a NAND flash controller (NFC) 142 and a memory 144 all operatively coupled via an internal bus.

The host interface 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (DATA), enhanced small disk interface (ESDI) and integrated drive electronics (IDE The ECC component 138 may detect and correct an error contained in the data read from the memory device 150. In other words, the ECC component 138 may perform an error correction decoding process to the data read from the memory device 150 through an ECC code used during an ECC encoding process. According to a result of the error correction decoding process, the ECC component 138 may output a signal, for example, an error correction success/fail signal. When the number of error bits is more than a threshold value of correctable error bits, the ECC component 138 may not correct the error bits, and may output an error correction fail signal.

The ECC component 138 may include a randomizer for randomizing data to store in the memory device 150 while equally retaining the ratio of 0's to 1's in the data and a de-randomizer for recovering the randomized data. The randomizer may perform the randomizing operation before or after data to be programmed are encoded through an ECC encoder. The de-randomizer may perform the de-randomizing operation before or after data read from the memory device 150 are decoded through an ECC decoder.

The ECC component 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, error correction is not limited to these techniques. As such, the ECC component 138 may include all circuits, modules, systems or devices for suitable error correction.

The PMU 140 may provide and manage power of the controller 130.

The NFC 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the NFC 142 may generate a control signal for the memory device 150 and process data to be provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150. Other type memory/storage interface may be used for a different type memory device.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or externally to the controller 130. FIG. 1 illustrates the memory 144 disposed within the controller 130. In an embodiment, the memory 144 may be embodied by an external volatile memory having a memory interface transferring data between the memory 144 and the controller 130.

As described above, the memory 144 stores data required for performing a data read/write operation between the host 102 and the memory device 150 and data when the data write/read operation is performed. In order to store such data, the memory 144 includes a program memory, data memory, write buffer/cache, read buffer/cache, data buffer/cache and map buffer/cache.

The processor 134 may control the overall operations of the memory system 110. The processor 134 may drive firmware to control the overall operations of the memory system 110. The firmware may be referred to as flash translation layer (FTL).

For example, the controller 130 performs an operation requested from the host 102 in the memory device 150 through the processor 134 implemented with a microprocessor or central processing unit (CPU). In other words, the controller 130 performs a command operation corresponding to a command received from the host 102 in the memory device 150. The controller 130 performs a foreground operation as the command operation corresponding to the command received from the host 102. For example, the controller 130 may perform a program operation corresponding to a write command, a read operation corresponding to a read command, an erase operation corresponding to an erase command or a parameter set operation corresponding to a set parameter command or set feature command as a set command.

The controller 130 may perform a background operation for the memory device 150 through the processor 134 implemented with a microprocessor or CPU. The background operation for the memory device 150 includes an operation of copying data stored in an arbitrary memory block among the memory blocks 152, 154 and 156 of the memory device 150 to another arbitrary memory block (e.g. a garbage collection (GC) operation), an operation of swapping data among the memory blocks 152, 154 and 156 or data stored therein (e.g., a wear leveling (WL) operation), an operation of storing map data stored in the controller 130 into the memory blocks 152, 154 and 156 (e.g., a map flush operation), or a bad management operation for the memory device 150 (e.g., a bad block management operation of checking and processing a bad block in the memory blocks 152, 154 and 156 in the memory device 150).

In the memory system in accordance with an embodiment, when the memory device 150 performs a command operation corresponding to a command received from the host 102, for example, a program operation corresponding to a write command or a read operation corresponding to a read command, the controller 130 may check for an error of data transferred between the controller 130 and the memory device 150 in the memory system, such that the memory device 150 performs the program operation or the read operation.

The controller 130 may transfer data corresponding to the write command received from the host 102 to the memory device 150, and the memory device 150 may perform an error check operation and program operation on the data transferred from the controller 130. The memory device 150 may perform the program operation at the same time as or before/after the error check operation.

In an embodiment, the memory device 150 may perform the program operation after the error check operation. For example, the memory device 150 may perform the error check operation on the data transferred from the controller 130. Only when no error is contained in the data, the memory device 150 may perform the program operation to store the data in the memory cell array of the memory device 150, i.e., memory blocks 152, 154 and 156 in the memory device 150, and then transfer a signal indicating success of the program operation to the controller 130. On the other hand, when an error is contained in the data transferred from the controller 130, the memory device 150 may request the controller 130 to retransfer that data. The memory device 150 may check for an error on the data stored in the memory blocks 152, 154 and 156 of the memory device 150. When an error is contained in the data stored in the memory blocks 152, 154 and 156, the memory device 150 may perform a program operation to store data in the memory blocks 152, 154 and 156 again. Furthermore, when the data are normally stored in the memory blocks 152, 154 and 156, for example, when no error is contained in such data, the memory device 150 may transfer a signal indicating success of the program operation to the controller 130.

In an embodiment, the memory device 150 may start the program operation before the error check operation on the data transferred from the controller 130 is completed. When a time required for the error check operation is less than a time required for the program operation, the memory device 150 may complete the error check operation before the program operation is completed, in order to minimize delay caused by the error check operation.

When at least one of the program operation and the error check operation is completed, the memory device 150 may transfer a signal indicating the result of the program operation and/or the error check operation to the controller 130. When the result of the error check operation indicates that an error is contained in the data, the memory device 150 may transfer to the controller 130 a retransfer request for the corresponding data in the form of a signal indicating the result of the error check operation. The controller 130 may newly designate the address of a region where retransferred data are to be stored in the memory device 150.

In an embodiment, the memory device 150 may perform an error check operation and a program operation on the retransferred data. The memory device 150 may repeat the data retransfer request operation, the error check operation and the program operation, until data containing no error are finally stored in the memory blocks of the memory device 150.

In an embodiment, when data containing no error are not stored in the memory blocks of the memory device 150, even though the retransfer request operation has been repeated a set number of times (for example, three times), the memory device 150 may determine that the program operation of the corresponding data failed, and end the program operation for storing the data.

The memory device 150 may perform an error check operation on the data stored in the memory blocks 152, 154 and 156 of the memory device 150. When the result of the error check operation indicates that an error is contained in the data stored in the memory blocks 152, 154 and 156, the memory device 150 may perform a program operation to store data in the memory blocks 152, 154 and 156 again. Furthermore, when the data are normally stored in the memory blocks 152, 154 and 156 of the memory device 150, for example, when no error is contained in the data stored in the memory blocks 152, 154 and 156, the memory device 150 may transfer a signal indicating success of the program operation to the controller 130.

The controller 130 may request the memory device 150 to perform a read operation on data corresponding to a read command received from the host 102, and the memory device 150 may read data stored in the memory cell array of the memory device 150, i.e., the plurality of memory blocks 152, 154 and 156 in the memory device 150. The memory device 150 may check for an error on the data read from the memory blocks 152, 154 and 156. The memory device 150 may transfer the read data to the controller 130 only when no error is contained in the data read from the memory blocks 152, 154 and 156, and the controller 130 may check for an error on the data transferred from the memory device 150. On the other hand, when an error is contained in the data read from the memory blocks 152, 154 and 156, the memory device 150 may reread the data stored in the memory blocks 152, 154 and 156. Furthermore, when no error is contained in the data transferred from the memory device 150, the controller 130 may transfer the data to the host 102, or provide the data corresponding to the read command received from the host 102 to the host 102. On the other hand, when an error is contained in the data transferred from the memory device 150, the controller 130 may request the memory device 150 to retransfer the data or perform a read operation in the memory device 150 again. Furthermore, the controller 130 may perform an error correction operation, for example, error correction decoding on the data transferred from the memory device 150.

That is, in the memory system in accordance with an embodiment, the memory device 150 may perform the error check operation on data transferred from the controller 130 and the program operation on the data transferred from the controller 130, and store the data in the memory blocks 152, 154 and 156 of the memory device 150. Furthermore, the memory device 150 may check for an error on the data stored in the memory blocks 152, 154 and 156 of the memory device 150, and confirm success of the program operation only for normal data containing no error. In the memory system in accordance with an embodiment, the memory device 150 may check for an error on data read from the memory blocks 152, 154 and 156, and then transfer data containing no error to the controller 130, and the controller 130 may also check for an error on the data transferred from the memory device 150, and provide data containing no error to the host 102.

Thus, in the memory system in accordance with an embodiment, the memory device 150 can check for an error on the data transferred from the controller 130, the data stored in the memory blocks 152, 154 and 156, and the data read from the memory blocks 152, 154 and 156. In other words, when the program operation and the read operation are performed, the memory device 150 and the controller 130 can perform the error check operation on the data, thereby improving the performance of the program operation and the read operation. By way of example, it has been described that the memory device 150 performs the error check operation on the data when performing the command operation corresponding to the command received from the host 102, for example, the program operation or read operation corresponding to the write command or read command. As described above, however, the memory device 150 may perform the error check operation on the data, even during a background operation for the memory device 150, for example, a garbage collection operation, wear leveling operation or map flush operation is performed. Furthermore, the configuration in which the memory device 150 of the memory system in accordance with an embodiment performs the error check operation on the data will be described in more detail below with reference to FIGS. 5 to 8.

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
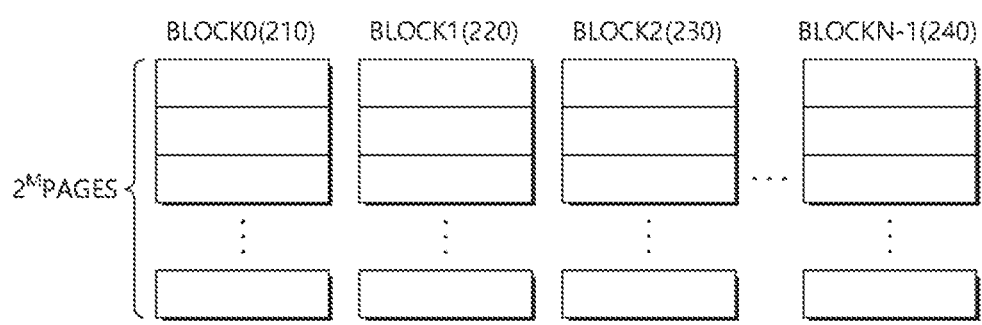
FIG. 2 is a schematic diagram illustrating an exemplary configuration of a memory device employed in the memory system shown in FIG. 1.

FIG. 2 is a schematic diagram illustrating the memory device 150.

Referring to FIG. 2, the memory device 150 may include a plurality of memory blocks 0 to N−1, and each of the blocks 0 to N−1 may include a plurality of pages, for example, 2M pages, the number of which may vary according to circuit design. Memory cells included in the respective memory blocks 0 to N−1 may be one or more of a single level cell (SLC) storing 1-bit data, or a multi-level cell (MLC) storing 2-bit or more bit data such as a triple level cell (TLC) storing 3-bit data, a quadruple level cell (QLC) storing 4-bit level cell, a multiple level cell storing 5-or-more-bit data, and the like.

Figure 3:
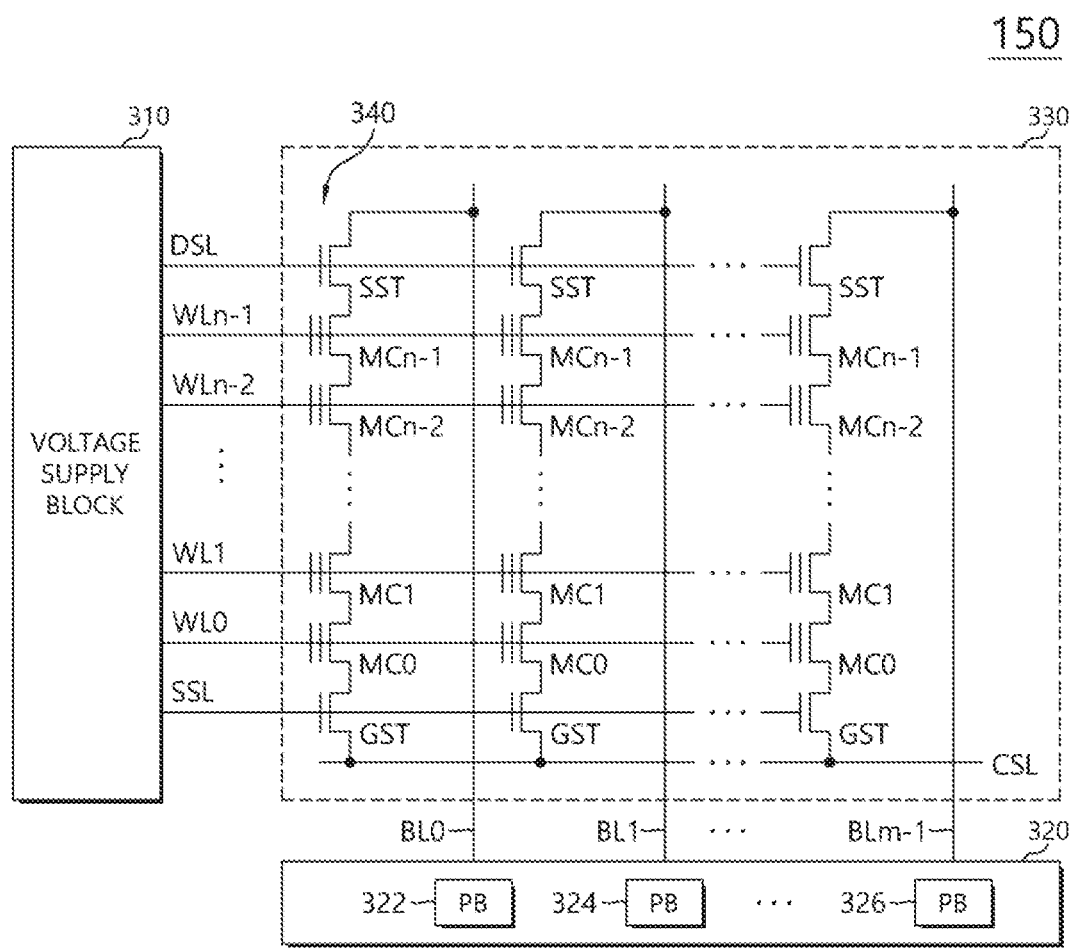
FIG. 3 is a circuit diagram illustrating an exemplary configuration of a memory cell array of a memory block in the memory device shown in FIG. 2.

FIG. 3 is a circuit diagram illustrating an exemplary configuration of a memory cell array of a memory block in the memory device 150.

Referring to FIG. 3, a memory block 330, which may correspond to any of the plurality of memory blocks 152 to 156 of the memory system 110, may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

The memory device 150 may further include a current sensing circuit (CSC) (not illustrated). The current sensing circuit may measure currents of latches included in page buffers. That is, since the currents of the latches are changed depending on whether a data bit to be stored in a page is 0 or 1, the memory device 150 may check the ratio of 0's to 1's in the data to be stored in the page and a fail of the data, based on the currents measured through the current sensing circuit. The operation of checking the ratio of 0's to 1's in the data through the current sensing circuit is one technique; however, other publicly known techniques capable of checking the ratio of 0's to 1's in data can be applied to the present disclosure.

Figure 4:
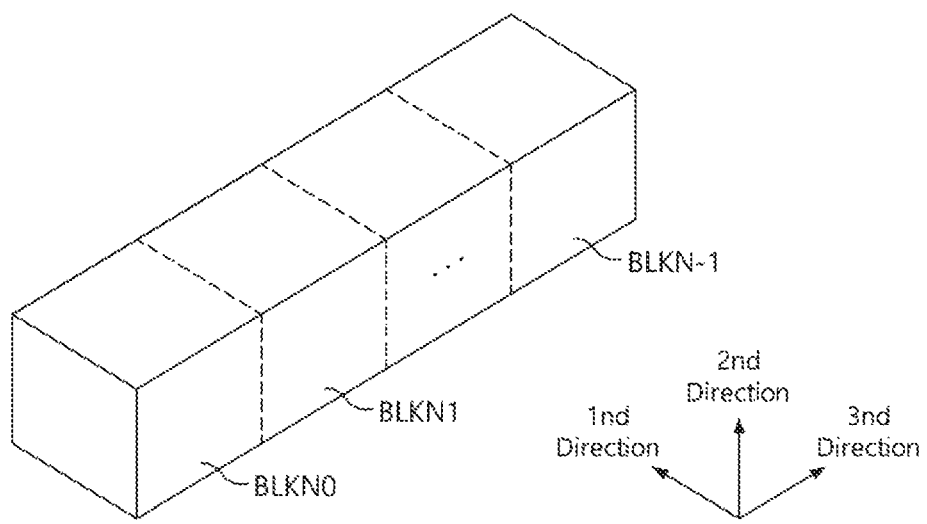
FIG. 4 is a schematic diagram illustrating an exemplary three-dimensional structure of the memory device shown in FIG. 2.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

Each of the memory blocks 330 in the memory device 150 may include a plurality of NAND strings NS extended in a second direction, and a plurality of NAND strings NS extended in first and third directions. Each of the NAND strings may be coupled to a bit line BL, one or more string select lines SSL, one or more ground select line GSL, a plurality of word lines WL, one or more dummy word lines DWL and a common source line CSL, and include a plurality of transistors structures TS.

That is, in the plurality of memory blocks 152, 154 and 156 of the memory device 150, each of the memory blocks 330 may be coupled to a plurality of bits lines BL, a plurality of string select lines SSL, a plurality of ground select lines GSL, a plurality of word lines WL, a plurality of dummy word lines DWL and a plurality of common source lines CSL, and thus include a plurality of NAND strings NS. Furthermore, in each of the memory blocks 330, the plurality of NAND strings NS may be coupled to one bit line BL, such that a plurality of transistors can be implemented in one NAND string NS. The string select transistor SST in each of the NAND strings NS may be coupled to the corresponding bit line BL, and the ground select transistor GST in each of the NAND strings NS may be coupled to the common source line CSL. Between the string select transistor SST and the ground select transistor GST in each of the NAND strings NS, memory cells MC may be provided. That is, each of the memory blocks 330 in the plurality of memory blocks 152, 154 and 156 may include a plurality of memory cells. Detailed description is made with reference to FIGS. 5 to 8, for data processing with respect to the memory device 150 in a memory system in accordance with an embodiment, particularly, a data processing operation in the case of performing a command operation corresponding to a command received from the host 102.

Figure 5:
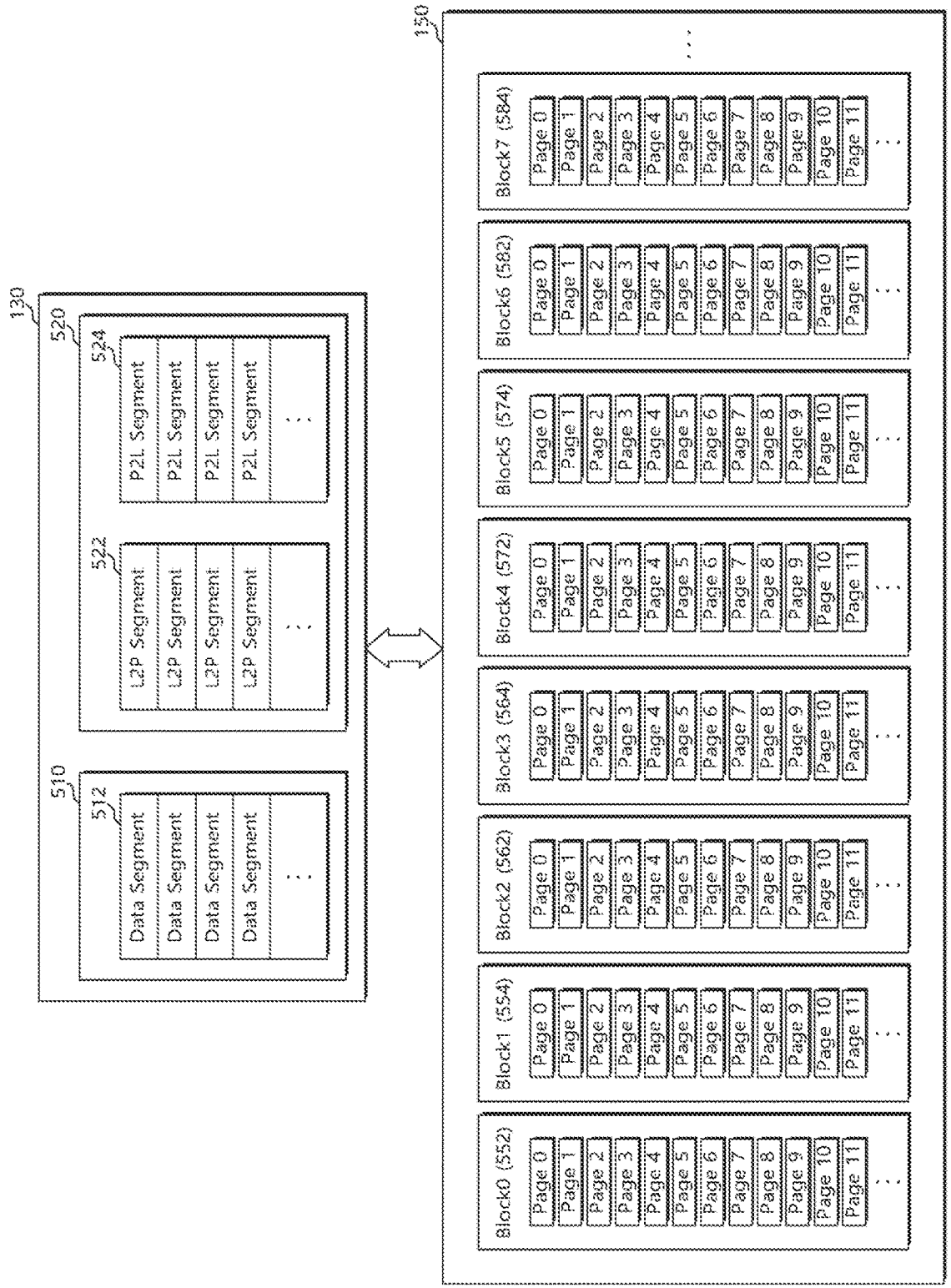
FIGS. 5 to 7 are diagrams illustrating an exemplary data processing operation to the memory system shown in FIGS. 1 to 4.
Figure 6:
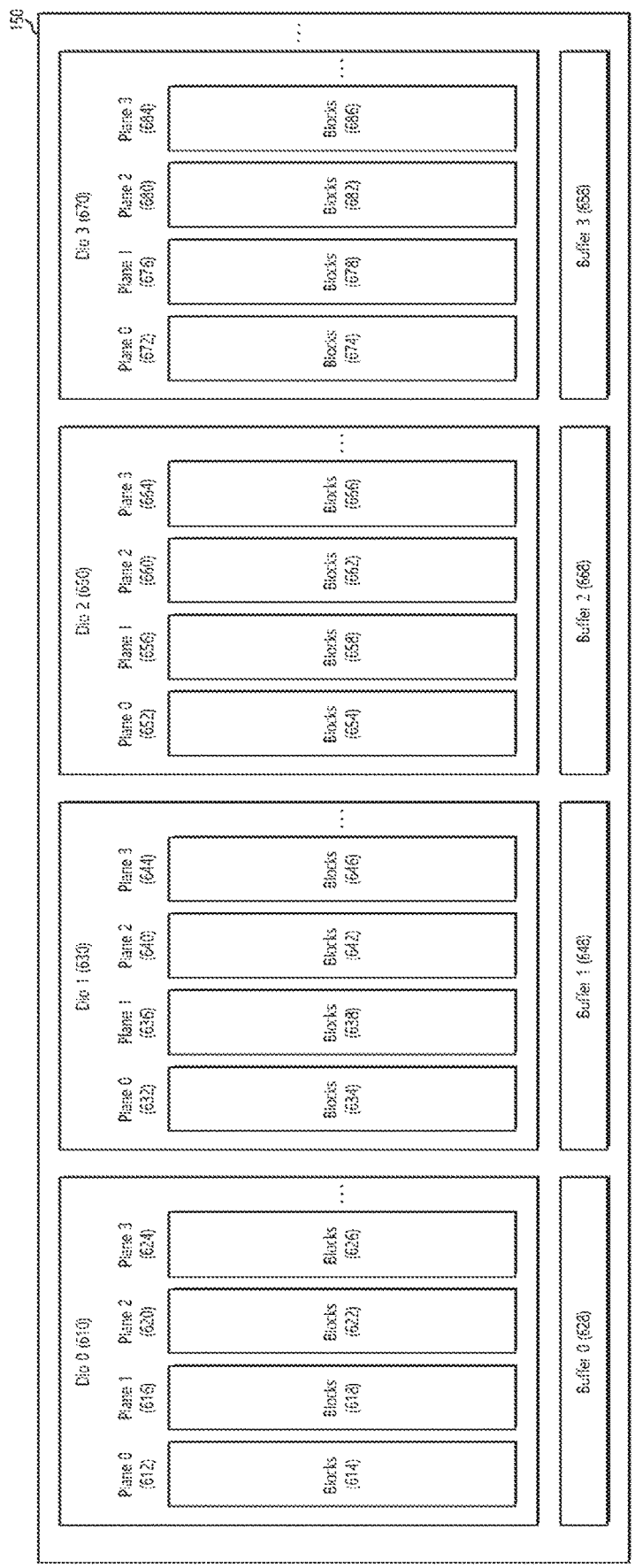
Figure 7:
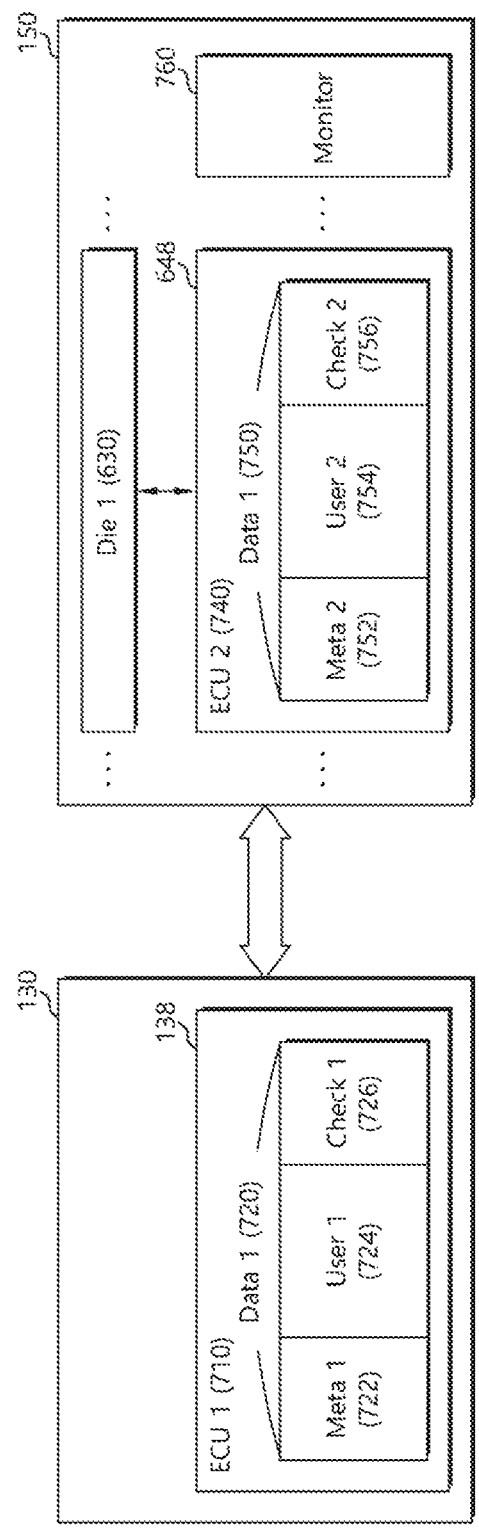

FIGS. 5 to 7 are diagrams illustrating a data processing operation to the memory system 110. By way of example, a data processing operation when the memory system 110 of FIG. 1 performs a command operation corresponding to a command received from the host 102, for example, a program operation corresponding to a write command received from the host 102 or a read operation corresponding to a read command received from the host 102 is described.

Also, by way of example, a data processing operation when the memory system 110 stores write data corresponding to a write command received from the host 102 in the buffer/cache in the memory 144 of the controller 130, programs the data stored in the buffer/cache to the plurality of memory blocks in the memory device 150 (program operation), and updates map data in response to the program operation to the memory device 150 is described. Furthermore, by way of example, a data processing operation when the memory system 110 checks map data of data corresponding to a read command in the case where the read command for data stored in the memory device 150 is received from the host 102, read the data corresponding to the read command from the memory device 150, stores the read data in the buffer/cache in the memory 144 of the controller 130, and provides the data stored in the buffer/cache to the host 102 is described.

While it has been described that the data processing operation of the memory system 110 is performed by the controller 130, such description is an example only. As described above, the processor 134 in the controller 130 performs the data processing operation through FTL. For example, the controller 130 stores user data and meta data corresponding to a write command received from the host 102 in the buffer in the memory 144 of the controller 130, and programs the data stored in the buffer to an arbitrary memory block among the plurality of memory blocks in the memory device 150 (program operation).

The meta data may include first map data containing L2P information (hereafter, referred to as logical information) on the data stored in the memory blocks and second map data containing P2L information (hereafter, referred to as physical information), in response to the program operation. The meta data may further include information on command data corresponding to the command received from the host 102, information on the command operation corresponding to the command, information on memory blocks of the memory device 150 in which the command operation is performed, and information on map data corresponding to the command operation. In other words, the meta data may include all of the other information and data excluding the user data corresponding to the command received from the host 102.

In an embodiment, the controller 130 may perform a command operation corresponding to a command received from the host 102. For example, when a write command is received from the host 102, the controller 130 may perform a program operation corresponding to the write command. The controller 130 may transfer user data corresponding to the write command to the memory device 150, and the memory device 150 may check for an error on the user data transferred from the controller 130, and program the transferred user data to the memory blocks of the memory device 150, the memory blocks including open memory blocks, free memory blocks or empty memory blocks on which an erase operation has been performed. Furthermore, the controller 130 may transfer mapping information to the memory device 150, the mapping information including mapping information between logical addresses and physical addresses on the user data stored in the memory blocks, i.e., first map data containing an L2P map table or L2P map list having logical information recorded therein and mapping information between logical addresses and physical addresses on the memory blocks having the user data stored therein, i.e., second map data containing a P2L map table or P2L map list having physical information recorded therein. The memory device 150 may check for an error on the map data transferred from the controller 130, and store the transferred map data in empty memory blocks, open memory blocks or free memory blocks among the memory blocks of the memory device 150.

When receiving a write command from the host 102, the controller 130 may store user data corresponding to the write command in the memory blocks, and store meta data in the memory blocks, the meta data containing the first and second map data for the user data stored in the memory blocks. The memory device 150 may check for an error on the user data and meta data transferred from the controller 130, store the transferred user data and meta data in the memory blocks of the memory device, and request the controller 130 to retransfer user data and meta data containing an error. In particular, when data segments of the user data are stored in the memory blocks of the memory device 150, the controller 130 may generate and update L2P segments of the first map data and P2L segments of the second map data as meta segments of the meta data, i.e. map segments of the map data, and then store the map segments in the memory blocks of the memory device 150. The controller 130 may load the map segments stored in the memory blocks of the memory device 150 to the memory 144 in the controller 130, in order to update the map segments.

When receiving a read command from the host 102, the controller 130 may perform a read operation corresponding to the read command by reading data corresponding to the read command from the memory device 150, storing the read data in a buffer/cache in the memory 144 of the controller 130, and then providing the data stored in the buffer/cache to the host 102. The memory device 150 may check for an error on the data read from the memory blocks of the memory device 150, and transfer only data containing no error to the controller 130. For data containing an error, the memory device 150 may reread the data from the memory blocks of the memory device 150, check for an error on the reread data, and transfer only data containing no error to the controller 130. Furthermore, the controller 130 may check for an error on the data transferred from the memory device 150, and then provide only data containing no error to the host 102. For data containing an error, the controller 130 may request the memory device to retransfer the data, or perform an error correction operation, for example, error correction decoding. The data processing operation of the memory system in accordance with an embodiment will be described in more detail with reference to FIGS. 5 to 7.

First, referring to FIG. 5, the controller 130 may perform a command operation corresponding to a command received from the host 102, for example, a program operation corresponding to a write command received from the host 102. The controller may program user data corresponding to the write command to memory blocks 552, 554, 562, 564, 572, 574, 582 and 584 of the memory device 150, generate and update meta data for the user data in response to the program operation of the user data to the memory blocks 552, 554, 562, 564, 572, 574, 582 and 584, and then store the meta data in the memory blocks 552, 554, 562, 564, 572, 574, 582 and 584 of the memory device 150.

The controller 130 may generate and update information indicating that the user data are stored in pages included in the memory blocks 552, 554, 562, 564, 572, 574, 582 and 584 of the memory device 150, for example, first and second map data. In other words, the controller 130 may generate and update logical segments of the first map data, i.e. L2P segments and physical segments of the second map data, i.e. P2L segments, and then store the L2P segments and the P2L segments in the pages in the memory blocks 552, 554, 562, 564, 572, 574, 582 and 584 of the memory device 150.

For example, the controller 130 may cache and buffer the user data corresponding to the write command received from the host 102 into a first buffer 510 in the memory 144 of the controller 130. That is, the controller 130 may store data segments 512 of the user data in the first buffer 510 serving as a data buffer/cache, and then store the data segments 512 stored in the first buffer 510 into the pages in the memory blocks 552, 554, 562, 564, 572, 574, 582 and 584 of the memory device 150. The controller 130 may add check bits such as parity bits, cyclical redundancy check (CRC) bits and hash code bits to the data segments 512 and transfer the data segments 512 containing the check bits to the memory device 150, in order to check for an error on the data segments 512 stored in the first buffer 510, and the memory device 150 may check for an error on the data segments 512 transferred from the controller 130 or specifically the data segments 512 containing the check bits, and program the data segments 512 to the pages in the memory blocks 552, 554, 562, 564, 572, 574, 582 and 584 of the memory device 150.

As the data segments 512 of the user data corresponding to the write command received from the host 102 are programmed and stored into the pages in the memory blocks 552, 554, 562, 564, 572, 574, 582 and 584 of the memory device 150, the controller 130 may generate and update the first and second map data, and store the first and second map data in a second buffer 520 in the memory 144 of the controller 130 or store the L2P segments 522 of the first map data and the P2L segments 524 of the second map data for the user data into the second buffer 520 serving as a map buffer/cache. As described above, the second buffer 520 in the memory 144 of the controller 130 may store the L2P segments 522 of the first map data and the P2L segments of the second map data or a map list for the L2P segments 522 of the first map data and a map list for the P2L segments 524 of the second map data. Furthermore, the controller 130 may store the L2P segments 522 of the first map data and the P2L segments 524 of the second map data, which are stored in the second buffer 520, into the pages in the memory blocks 552, 554, 562, 564, 572, 574, 582 and 584 of the memory device 150. The controller 130 may add check bits such as parity bits, CRC bits and hash code bits to the map segments 522 and 524 and transfer the map segments 522 and 524 containing the check bits to the memory device 150, in order to check for an error on the map segments 522 and 524 stored in the second buffer 520, and the memory device 150 may check for an error on the map segments 522 and 524 transferred from the controller 130 or specifically the map segments 522 and 524 containing the check bits, and program and store the map segments 522 and 524 into the pages in the memory blocks 552, 554, 562, 564, 572, 574, 582 and 584 of the memory device 150.

Furthernnore, the controller 130 performs a command operation corresponding to a command received from the host 102, for example, a read operation corresponding to a read command received from the host 102. The controller 130 checks map segments of user data corresponding to the read command, for example, the L2P segments 522 of the first map data and the P2L segments 524 of the second map data, which are loaded into the second buffer 520, reads user data stored in pages in the corresponding memory blocks among the memory blocks 552, 554, 562, 564, 572, 574, 582 and 584 of the memory device 150, stores data segments 512 of the read user data in the first buffer 510, and then provides the data segments 512 to the host 102. The memory device 150 reads the user data stored in the corresponding pages of the memory blocks 552, 554, 562, 564, 572, 574, 582 and 584 of the memory device 150, checks for an error on the read user data, and transmits only user data containing no error to the controller 130. The controller 130 checks for an error on the user data transmitted from the memory device 150, and then provides only the user data containing no error to the host 102. On the other hand, when an error is contained in the read user data, the memory device 150 rereads the user data stored in the corresponding pages of the memory blocks 552, 554, 562, 564, 572, 574, 582 and 584.

Furthermore, when an error is contained in the user data transferred from the memory device 150, the controller 130 requests the memory device 150 to retransfer the user data containing the error, or performs an error correction operation, for example, error correction decoding on the user data containing the error.

Referring to FIG. 6, the memory device 150 includes a plurality of memory dies, for example, a memory die 0(610), a memory die 1(630), a memory die 2(650) and a memory die 3(670). Each of the memory dies 610, 630, 650 and 670 includes a plurality of planes. For example, the memory die 0(610) includes a plane 0(612), a plane 1(616), a plane 2(620) and a plane 3(624), the memory die 1(630) includes a plane 0(632), a plane 1(636), a plane 2(640) and a plane 3(644), the memory die 2(650) includes a plane 0(652), a plane 1(656), a plane 2(660) and a plane 3(664), and the memory die 3(670) includes a plane 0(672), a plane 1(676), a plane 2(680) and a plane 3(684). The planes 612, 616, 620, 624, 632, 636, 640, 644, 652, 656, 660, 664, 672, 676, 680 and 684 in the memory dies 610, 630, 650 and 670 in the memory device 150 includes a plurality of memory blocks 614, 618, 622, 626, 634, 638, 642, 646, 654, 658, 662, 666, 674, 678, 682 and 686, respectively. For example, as described with reference to FIG. 2, the planes 612, 616, 620, 624, 632, 636, 640, 644, 652, 656, 660, 664, 672, 676, 680 and 684 includes N blocks Block®, Block1, BlockN−1 each including a plurality of pages, for example, 2M pages. The memory device 150 further includes a plurality of buffers corresponding to the respective memory dies 610, 630, 650 and 670, for example, a buffer 0(628) corresponding to the memory die 0(610), a buffer 1(648) corresponding to the memory die 1(630), a buffer 2(668) corresponding to the memory die 2(650) and a buffer 3(668) corresponding to the memory die 3(670).

While it is described that the buffers 628, 648, 668 and 688 in the memory device 150 are outside the corresponding memory dies 610, 630, 650 and 670, this is only an example. The buffers 628, 648, 668 and 688 may be present in the corresponding memory dies 610, 630, 650 and 670, and correspond to the planes 612, 616, 620, 624, 632, 636, 640, 644, 652, 656, 660, 664, 672, 676, 680 and 684 or the memory blocks 614, 618, 622, 626, 634, 638, 642, 646, 654, 658, 662, 666, 674, 678, 682 and 686 in the respective memory dies 610, 630, 650 and 670. Furthermore, the buffers 628, 648, 668 and 688 may be the plurality of buffers 322, 324 and 326 as described above with reference to FIG. 3. Alternatively, the buffers 628, 648, 668 and 688 may be a plurality of caches or registers in the memory device 150.

In an embodiment, the controller 130 may transfer data corresponding to a write command received from the host 102 to the memory device 150, and the data transferred from the controller 130 may be stored in the buffers 628, 648, 668 and 688 in the memory device 150. The memory device 150 may check for an error on the data transferred from the controller 130. Specifically, the buffers 628, 648, 668 and 688 in the memory device 150 may check for an error on the data transferred from the controller 130. The buffers 628, 648, 668 and 688 may program and store the data transferred from the controller 130 into pages of the memory blocks 614, 618, 622, 626, 634, 638, 642, 646, 654, 658, 662, 666, 674, 678, 682 and 686 in the respective memory dies 610, 630, 650 and 670, and request the controller 130 to retransfer data containing an error.

Furthermore, as described above, the controller 130 requests the memory device 150 to perform a read operation for data corresponding to a read command received from the host 102, and the data corresponding to the read command are read from the pages of the memory blocks 614, 618, 622, 626, 634, 638, 642, 646, 654, 658, 662, 666, 674, 678, 682 and 686 in the corresponding memory dies 610, 630, 650 and 670, and then stored in the buffers 628, 648, 668 and 688 in the memory device 150. The memory device 150 checks for an error on the read data. Specifically, the memory device 150 checks for an error on data read from the buffers 628, 648, 668 and 688 in the memory device 150. The buffers 628, 648, 668 and 688 in the memory device 150 transfer only data containing no error to the controller 130, and reread data containing an error from the pages of the memory blocks 614, 618, 622, 626, 634, 638, 642, 646, 654, 658, 662, 666, 674, 678, 682 and 686 in the corresponding memory dies 610, 630, 650 and 670. Furthermore, the controller 130 checks for an error on the data transferred from the buffers 628, 648, 668 and 688 in the memory device 150, and provides only data containing no error to the host 102. For data containing an error, the controller 130 requests the memory device to retransfer the data, or performs an error correction operation, for example, error correction decoding on the data containing an error.

In an embodiment, the error check operation in the buffers 628, 648, 668 and 688 in the memory device 150 and the error check operation in the controller 130 are performed when the memory system 110 including the controller 130 and the memory device 150 is in an abnormal state. In other words, during the command operation corresponding to the command received from the host 102, for example, the program operation corresponding to the write command or the read operation corresponding to the read command, the above-described error check operation is performed when the memory system 110 is in an abnormal state.

The abnormal state of the memory system 110 may indicate that a parameter related to requirements for the memory system 110, for example, an operation parameter, state parameter or operation environment parameter of the memory system 110 falls within an abnormal range when the command operation is performed. The requirements includes an operation clock, power level, current/voltage level, operation timing and temperature level, which correspond to the performance of the command operation. That is, the memory system 110 in accordance with an embodiment monitors the operation dock, power level, current/voltage level, operation timing and temperature level of the memory system 110, and checks the operation parameter, the state parameter or the operation environment parameter of the memory system 110, i.e. the requirement parameter of the memory system 110. When the requirement parameter of the memory system 110 falls within the abnormal range, the controller 130 determines that the memory system 110 is abnormal, and performs the above-described error check operation.

In particular, when the command operation is performed while the memory system 110 is abnormal, the reliability of the command operation may be reduced. Thus, the controller 130 performs the above-described error check operation in order to guarantee the reliability of the command operation which was performed while the memory system 110 was abnormal. That is, the error check operation in the buffers 628, 648, 668 and 688 in the memory device 150, for example, the error check operation in the buffers 628, 648, 668 and 688 in the memory device 150 for the data transferred from the controller 130, the error check operation in the buffers 628, 648, 668 and 688 included in the memory device 150 for the data read from the pages of the memory blocks 614, 618, 622, 626, 634, 638, 642, 646, 654, 658, 662, 666, 674, 678, 682 and 686 in the corresponding memory dies 610, 630, 650 and 670 in response to the read command, and the error check operation of the controller 130, for example, the error check operation of the controller 130 for the data transferred from the buffers 628, 648, 668 and 688 in the memory device 150 are performed when the memory system 110 is abnormal during the command operation.

The error check operation when the memory system in accordance with an embodiment performs the command operation corresponding to the command received from the host 102, for example, the program operation corresponding to the write command received from the host 102 or the read operation corresponding to the read command received from the host 102 will be described in detail with reference to FIG. 7. An error check operation when an arbitrary memory die among the plurality of memory dies 610, 630, 650 and 670 in the memory device 150, for example, the memory die 1(630) performs a command operation is described by way of example. As described above, however, the error check operation may be performed even when the plurality of memory dies 610, 630, 650 and 670 in the memory device 150 performs a background operation as well as the command operation, the background operation including a garbage collection operation, a wear leveling operation and a map flush operation.

Referring to FIG. 7, in the data 720 to be provided to and programmed into the memory device 150 during a program operation may include user data 724, metadata 722 for the user data 724, and check data 726 for error check of the data 720. An error check component 710 included in the controller 130 generates the check data 726, and includes the check data 726 in the data 720. Check bits of the data 720, that is, check bits for the metadata 722 and the user data 724 are included in the check data 726. For instance, the check bits may be one or more of parity bits, CRC bits, hash code bits and so forth.

The buffer 648 corresponding to the memory die 630 of the memory device 150 includes an error check component 740 which checks for an error of the data 720 transferred from the controller 130. In an embodiment, the error check component 740 may be disposed outside the buffer 648.

In an embodiment, an error check component is included in each of the buffers 628, 648, 668 and 688 corresponding to the memory dies 610, 630, 650 and 670. In another embodiment, the error check components may be included in an interface module which processes commands and data between the controller 130 and the memory device 150.

The interface module between the controller 130 and the memory device 150 performs a NAND flash interface operation, and is included in the memory device 150 to support processing of commands and data to be provided to and from the controller 130. Specifically, the interface module transfers commands and data between the controller 130 and the respective memory dies 610, 630, 650 and 670.

The error check components in the interface module of the memory device 150 perform error check operations to data to be provided to and from the controller 130 for all the memory dies 610, 630, 650 and 670. After performing the error check operations to all data of the memory dies 610, 630, 650 and 670 during a program operation, the error check components of the interface module transfer error-free data to buffers of corresponding memory dies, transfer signals indicating successes of program operations to the controller 130. After performing the error check operations to all data of the memory dies 610, 630, 650 and 670 during a read operation, the error check components of the interface module transfer, to the controller 130 error-free data read from corresponding memory dies. The error check components of the interface module may request retransfer of read data in correspondence to result values of the error check operations.

The error check component 740 of the buffer 648 performs an error check operation, for example, a mathematical operation or a logical operation, by using the data bits of the metadata 722, the data bits of the user data 724 and the check bits of the check data 726 in the data 720 transferred from the controller 130, and checks whether an error is included in the data 720 transferred from the controller 130. The error check component 740 may perform a single operation or a combined operation among an AND operation, an OR operation, a NOT operation, an XOR operation, a NOR operation, a NAND operation and so forth as the mathematical operation or the logical operation using the data bits and check bits of the data 720. The error check component 740 may perform an addition/subtraction operation or perform a bit-shifting operation of shifting bits to optional positions or in an optional direction.

After checking an error of the data 720 transferred from the controller 130, only in the case where an error is not included in the data 720 transferred from the controller 130, the error check component 740 transfers the error-free data 720 to the memory die 630 so that the error-free data 720 is programmed into the memory die 630. The error check component 740 may also check whether the data 720 stored in the corresponding pages of the memory blocks 634, 638, 642 and 646 have been programmed normally. In other words, the error check component 740 checks whether an error has occurred when transferring the data 720 from the buffer 648 to the corresponding pages of the memory blocks 634, 638, 642 and 646 and whether the data 720 have been stored normally in the corresponding pages of the memory blocks 634, 638, 642 and 646. In order to check whether the data 720 stored in the corresponding pages have been programmed normally, the error check component 740 reads the data 720 stored in the corresponding pages and performs an error check operation by using the data bits and check bits of the read data.

In the case where an error is not included in the data 720 stored in the corresponding pages, that is, in the case where the data 720 transferred from the controller 130 have been programmed and stored normally, the error check component 740 transfers to the controller 130 a signal indicating success of the program operation. In the case where an error is included in the data 720 stored in the corresponding pages, that is, in the case where the data 720 transferred from the controller 130 have not been programmed and stored normally, the error check component 740 reprograms the data 720 transferred from the controller 130, in pages of the memory blocks 634, 638, 642 and 646.

In the case where an error is included in the data 720 transferred from the controller 130, the error check component 740 requests the controller 130 to retransfer the data 720 in which the error is included, and the controller 130 retransfers the data 720 to the memory device 150 in response to the retransfer request.

The error check component (ECU) 2 740 may check whether an error is contained in data, based on the ratio of 0's to 1's in the data. For example, when data corresponding to a read or program operation target have been already randomized through the randomizer, the ECU 2 740 may check whether an error is contained in the corresponding data, based on the ratio of 0's to in the data. The ECU 2 740 may check the ratio of 0's to 1's in the data through the current sensing circuit.

In order to perform a command operation corresponding to a command received from the host 102, for example, a read operation corresponding to a read command received from the host 102, the controller 130 requests the memory device 150 to perform a read operation on data corresponding to the read command. The memory device 150 may read data 2(750) corresponding to the read command from the corresponding pages of the memory blocks 634, 638, 642 and 646 in the memory die 1 (630) and then store the read data 2(750) in the buffer 1(648), in response to the request for the read operation. The data 2(750) corresponding to the read command may include user data 2(754) read from the corresponding pages, meta data 2(752) of the user data 2(754), and check data 2(756) for checking an error on the data 2(750) corresponding to the read command.

The data 2(750) corresponding to the read command are stored in the buffer 1(648) of the memory device 150, and the buffer 1(648) checks for an error on the data 2(750) corresponding to the read command, i.e. the data 2(750) read from the corresponding pages of the memory blocks 634, 638, 642 and 646 through the error check component 2(740). The error check component 2(740) checks for an error on the data 2(750) by performing an error check operation using the data bits and check bits of the data 2(750) read from the corresponding pages of the memory blocks 634, 638, 642 and 646. For example, the error check component 2(740) performs an error check operation, for example, a mathematical operation or logical operation, using the data bits of the memory data 2(752), the data bits of the user data 2(754) and the check bits of the check data 2(756) in the data 2(750) read from the corresponding pages of the memory blocks 634, 638, 642 and 646, and checks whether an error is contained in the data 2(750) read from the corresponding pages of the memory blocks 634, 638, 642 and 646 through the result value of the error check operation. The mathematical operation or logical operation using the data bits and check bits of the data 2(750), which is performed by the error check component 2(740), may include an AND operation, OR operation, NOT operation, XOR operation, NOR operation and NAND operation which are independently performed or combined. Furthermore, the error check component 2(740) may perform an add/drop operation or a bit shifting operation for shifting arbitrary bits to an arbitrary position or in an arbitrary direction.

The error check component 2(740) checks for an error on the data 2(750) read from the corresponding pages of the memory blocks 634, 638, 642 and 646, and then transfers the read data 2(750) to the controller 130, only when no error is contained in the read data 2(750). The error check component 2(740) may generate check data 2(756) and include the check data 2(756) in the data 2(750), in order to check for an error on the read data 2(750). Then, the error check component 2(740) may transfer the data 2(750) including the check data 2(756) to the controller 130. The check data 2(756) includes the check bits of the data 2(750), i.e. the check bits for the meta data 2(752) and the user data 2(754). For example, the check component 2(740) may generate the check data 2(756) using parity bits, CRC bits and hash code bits as the check bits, and include the check data 2(756) in the data 2(750).

The error check component 1(710) checks for an error on the data 2(750) transferred from the memory device 150. That is, the error check component 1(710) checks whether an error occurred, when the memory device 150 transfers the data 2(750) to the controller 130. For example, the error check component 1(710) checks whether an error occurred due to a bit flip in the data 2(750), when the memory device 150 transfers the data 2(750) to the controller 130. In particular, the error check component 1(710) may check for an error on the data 2(750) by performing an error check operation using the data bits and check bits of the data 2(750). For example, the error check component 1(710) performs an error check operation, for example, a mathematical operation or logical operation, using the data bits of the meta data 2(752), the data bits of the user data 2(754) and the check bits of the check data 2(756) in the data 2(750) transferred from the memory device 150, and checks whether an error is contained in the data 2(750) transferred from the memory device 150 through the result value of the error check operation. The mathematical operation or logical operation using the data bits and check bits of the data 2(750), which is performed by the error check component 1(710), may include an AND operation, OR operation, NOT operation, XOR operation, NOR operation and NAND operation which are independently performed or combined. Furthermore, the error check component 1(710) may perform an add/drop operation or a bit shifting operation for shifting arbitrary bits to an arbitrary position or in an arbitrary direction.

The error check component 1(710) checks for an error on the data 2(750) transferred from the memory device 150, and then provides the data 2(750) transferred from the memory device 150 to the host 102 only when no error is contained in the data 2(750) transferred from the memory device 150. On the other hand, when an error is contained in the data 2(750) transferred from the memory device 150, the error check component 1(710) requests the memory device 150 to retransfer the data 2(750) containing the error. The memory device 150 retransfers the data 2(750) to the controller 130 in response to the retransfer request. When an error is contained in the data 2(750) transferred from the memory device 150, the error check component 1(710) may perform an error correction operation, for example, error correction decoding.

The error check component 2(740) checks for an error on the read data 2(750) read from the corresponding pages of the memory blocks 634, 638, 642 and 646. When an error is contained in the read data 2(750), the error check component 2(740) rereads the data 2(750) from the corresponding pages of the memory blocks 634, 638, 642 and 646, and checks for an error on the reread data 2(750). Only when no error is contained in the reread data 2(750), the error check component 2(740) transfers the reread data 2(750) to the controller 130.

The memory device 150 includes a monitor 760 for checking whether the memory system 110 including the controller 130 and the memory device 150 is abnormal. While it is described that the monitor 760 which checks an abnormal state of the memory system 110 when the command operation corresponding to the command received from the host 102 is performed is included in the memory device 150, this is only an example. The monitor 760 may be included in the controller 130, or present inside or outside the memory system 110 separately from the controller 130 and the memory device 150. It is also described that the monitor 760 checks an abnormal state of the memory system 110 when the command operation corresponding to the command received from the host 102 is performed. As described above, however, the monitor 760 may check an abnormal state of the memory system 110 even when the memory system 110 performs a background operation, for example, a garbage collection operation, wear leveling operation or map flush operation.

That is, when the controller 130 and the memory device 150 of the memory system 110 perform the command operation corresponding to the command received from the host 102, for example, the program operation corresponding to the write command or the read operation corresponding to the read command, the monitor 760 checks whether the memory system 110 is abnormal, i.e. whether the controller 130 and the memory device 150 which perform the command operation are abnormal. When the controller 130 and the memory device 150 are abnormal, the monitor 760 controls the controller 130 and the memory device 150 to check for an error on the data corresponding to the command operation.

More specifically, while the controller 130 and the memory device 150 perform the command operation, the monitor 760 monitors the operation docks, power levels, current/voltage levels, operation timings and temperature levels of the controller 130 and the memory device 150, which correspond to the performance of the command operation. In other words, the monitor 760 monitors the requirement parameters for the controller 130 and the memory device 150, corresponding to the performance of the command operation, for example, the operation parameters, state parameters or operation environment parameters of the controller 130 and the memory device 150. The monitor 760 checks whether the requirement parameters for the controller 130 and the memory device 150 fall within an abnormal range. When the requirement parameters fall within the abnormal range, the monitor 760 may transfer a trigger signal for an error check operation to the controller 130 and the memory device 150, such that the controller 130 and the memory device 150 perform the error check operation as described above. That is, when the controller 130 and the memory device 150 perform the command operation, the monitor 760 monitors the operation clocks, power levels, current/voltage levels, operation timings and temperature levels of the controller 130 and the memory device 150. Then, when the operation clocks, power levels, current voltage levels, operation timings and temperature levels fall within the abnormal range, the monitor 760 determines that the command operation is performed while the controller 130 and the memory device 150 are abnormal. Thus, the monitor 760 transfers the trigger signal to the controller 130 and the memory device 150 to perform the error check operation.

The controller 130 and the memory device 150 which receive the trigger signal from the monitor 760 perform the error check operation on the data. That is, as described above, the error check component 2(740) performs the error check operation on data 1(720) transferred from the controller 130, performs the error check operation on the data 1(720) programmed to the corresponding pages of the memory blocks 634, 638, 642 and 646 in the memory die 1(630), and performs the error check operation on the data 2(750) read from the corresponding pages of the memory blocks 634, 638, 642 and 646 in the memory die 1(630). Furthermore, the error check component 1(710) performs the error check operations on the data 2(750) transferred from the memory device 150.

When the memory system in accordance with an embodiment performs a background operation between the controller 130 and the memory device 150, the memory system performs an error check operation on data corresponding to the background operation, through the error check components in the controller 130 and the memory device 150. In particular, in the memory system in accordance with an embodiment, the monitor 760 monitors the requirement parameters for the controller 130 and the memory device 150, corresponding to the background operation. In other words, the monitor 760 monitors the operation clocks, power levels, current/voltage levels, operation timings and temperature levels of the controller 130 and the memory device 150 when the controller 130 and the memory device 150 perform the background operation. When it is checked that the background operation is performed while the controller 130 and the memory device 150 are abnormal, the monitor 760 transfers the trigger signal to the controller 130 and the memory device 150. The controller 130 and the memory device 150 perform the error check operation when the background operation is performed. For example, when a garbage collection operation, wear leveling operation or map flush operation is performed, the error check component in the memory device 150 performs the error check operation on the data transferred from the controller 130, the data read from the corresponding pages in the memory blocks of the memory device 150, and the data programmed to the corresponding pages in the memory blocks of the memory device 150, and the error check component in the controller 130 performs the error check operation on the data transferred from the memory device 150.

As a consequence, in the case where the controller 130 and the memory device 150 are in an abnormal state, error check operations are performed to data processed in the controller 130 and the memory device 150, whereby the reliability of data processing and operation in the memory system 110 may be improved and the operational performance of the memory system 110 may be improved.

Further, in the memory system 110 in accordance with an embodiment of the present disclosure, not only the controller 130 performs an error check operation, but also the memory device 150 performs an error check operation. For example, by performing error check operations to data transferred from the controller 130 and data stored in the memory device 150, processing of data including an error may be minimized, and the operational performance of the memory system 110 may be further improved.

In particular, in the memory system 110 in accordance with an embodiment of the present disclosure, by checking for an error which is likely to occur when transferring data between the controller 130 and the memory device 150, data transfer error between the controller 130 and the memory device 150 may be minimized, and the operational performance of the memory system 110 may be further improved.

Figure 8:
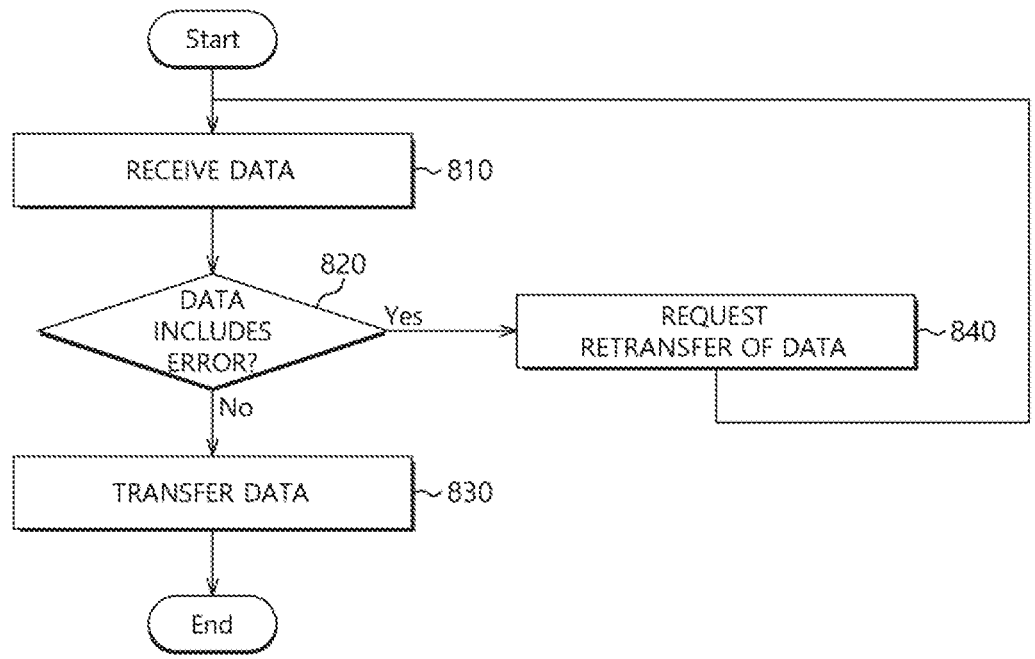
FIG. 8 is a flow chart illustrating an operation of the memory system shown in FIGS. 5 to 7 in accordance with an embodiment of the present invention.

FIG. 8 is a flowchart illustrating an operation process for processing data in the memory system 110.

Referring to FIG. 8, at step 810, the memory system 10 receives data from the host 102. The memory device 150 of the memory system 110 receives data from the controller 130 during a program operation. During a read operation, the controller 130 of the memory system 110 receives data read out from the memory device 150, and the read-out data are transferred to the controller 130 after an error check operation is performed in the memory device 150.

At step 820, an error check operation for checking an error on the data transferred from the controller 130 and a program operation for storing the data transferred from the memory device 150 may be performed, and the controller 130 may perform an error check operation on the data transferred from the memory device 150, in order to check whether the data contain an error. In particular, when data are transferred between the controller 130 and the memory device 150 while the controller 130 and the memory device 150 are in an abnormal state, the controller 130 may perform an error check operation on the data.

When an error is contained in the data transferred from the controller 130, the memory device 150 may request the controller 130 to retransfer the data containing an error at step S840. On the other hand, when no error is contained in the data transferred from the controller 130, the memory device 150 may confirm that the corresponding data have been successfully programmed. The memory device 150 may check for an error on the data programmed to the corresponding pages of the memory blocks in the memory dies. When no error is contained in the programmed data, the memory device 150 may transfer a program success signal to the controller 130. On the other hand, when an error is contained in the programmed data, the memory device 150 may reprogram data to the pages of the memory blocks in the memory dies.

In the case where an error is not included in the data transferred from the memory device 150, at step 830, the controller 130 transfers to the host 102 the data which do not include an error during the read operation. In the case where an error is included in the data transferred from the memory device 150 during the read operation at step 840, the controller 130 requests to the memory device 150 retransfer of the data which include the error. In the case where an error is included in the data transferred from the memory device 150 during the read operation, the controller 130 may perform an error correction operation to the transferred data. In the case where an error is not included in the data during the read operation, the controller 130 provides data, to the host 102.

Since detailed descriptions were made above with reference to FIGS. 5 to 7 for the data processing operations of the controller 130 and the memory device 150, further descriptions thereof will be omitted herein.

FIGS. 9 to 17 are diagrams schematically illustrating application examples of the data processing system of FIG. 1.

Figure 9:
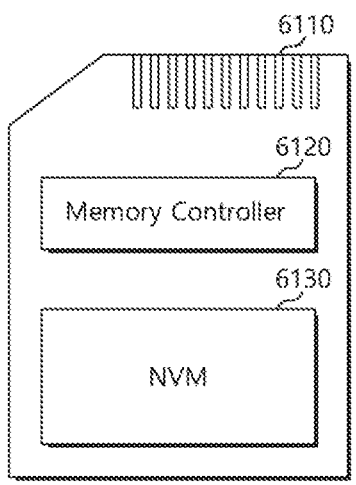
FIGS. 9 to 17 are diagrams schematically illustrating exemplary applications of the data processing system shown in FIG. 1 in accordance with various embodiments of the present invention.

FIG. 9 is a diagram schematically illustrating another example of the data processing system 100. FIG. 9 schematically illustrates a memory card system to which the memory system may be applied.

Referring to FIG. 9, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 and 5, and the memory device 6130 may correspond to the memory device 150 of the memory system 110 described with reference to FIGS. 1 and 5.

Thus, the memory controller 6120 may include a RAM, a processor, a host interface, a memory interface and an error correction component. The memory controller 130 may further include the elements shown in FIG. 5.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with an embodiment may be applied to wired/wireless electronic devices, particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 10:
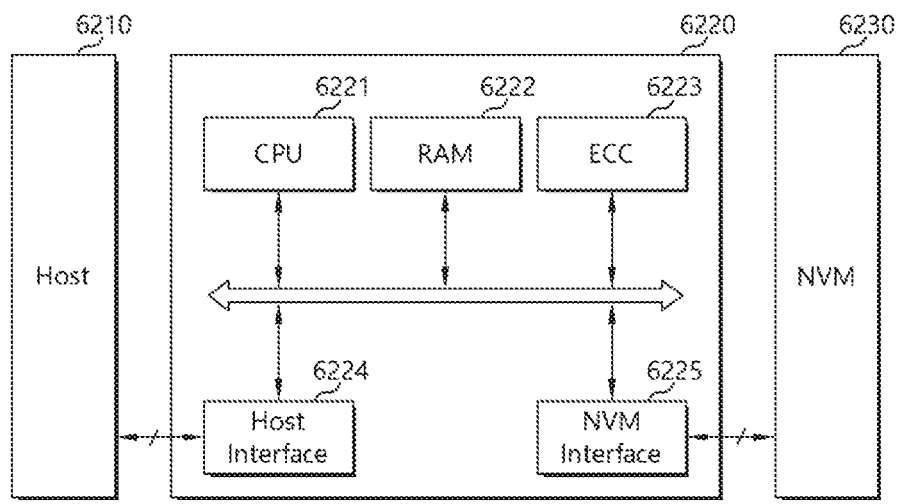

FIG. 10 is a diagram schematically illustrating another example of the data processing system including the memory system in accordance with an embodiment.

Referring to FIG. 10, the data processing system 6200 may include a memory device 6230 having one or more nonvolatile memories and a memory controller 6220 for controlling the memory device 6230. The data processing system 6200 illustrated in FIG. 10 may serve as a storage medium such as a memory card (CF, SD, micro-SD or the like) or USB device, as described with reference to FIG. 1. The memory device 6230 may correspond to the memory device 150 in the memory system 110 illustrated in FIGS. 1 and 5, and the memory controller 6220 may correspond to the controller 130 in the memory system 110 illustrated in FIGS. 1 and 5.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC component 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with an embodiment may be applied to wired/wireless electronic devices, particularly a mobile electronic device.

Figure 11:
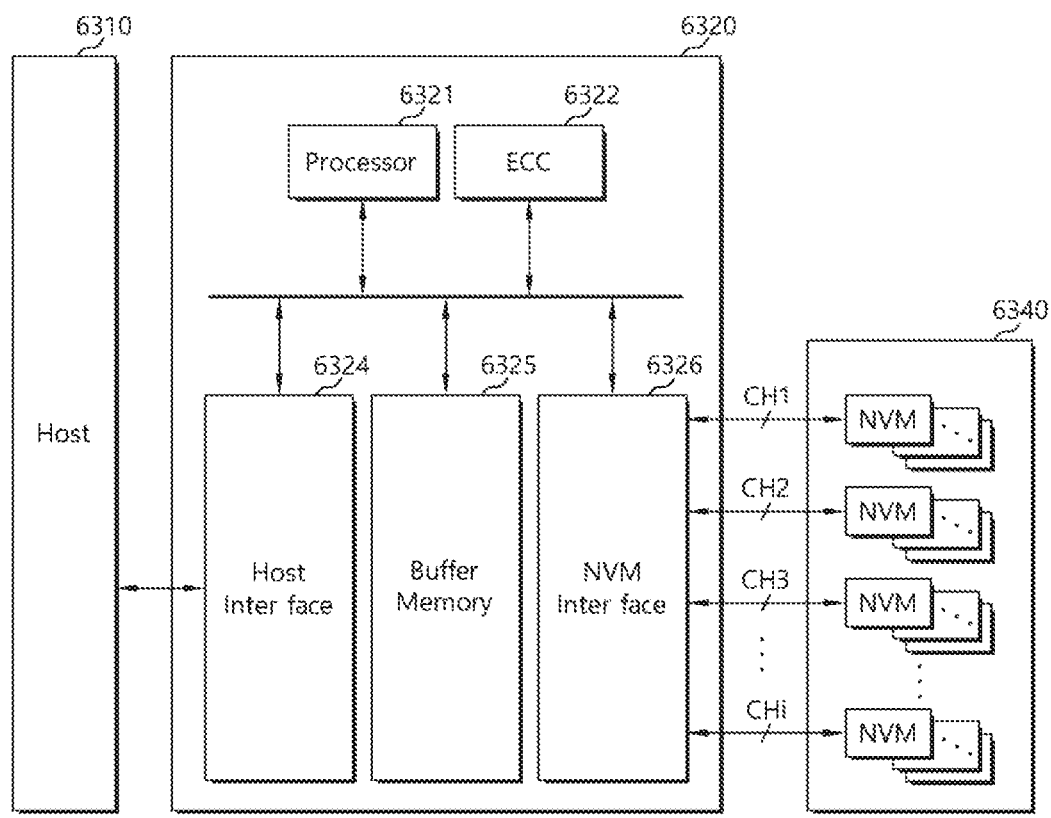
Figure 12:
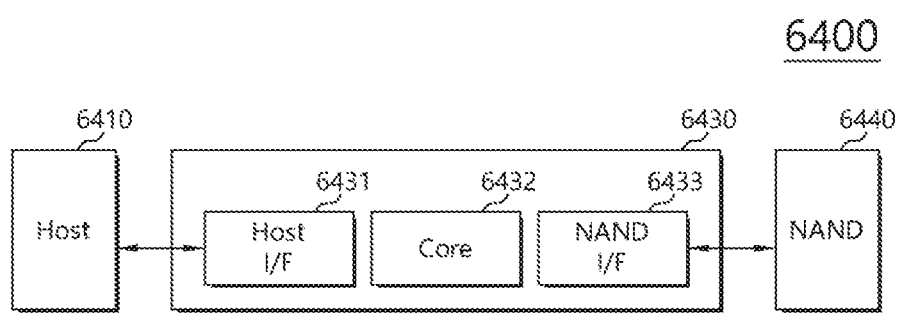

FIG. 11 is a diagram schematically illustrating another example of the data processing system including the memory system in accordance with an embodiment. FIG. 12 schematically illustrates an SSD including the memory system 110.

Referring to FIG. 11, the SSD 6300 may include a controller 6320 and a memory device 6340 including a plurality of nonvolatile memories. The controller 6320 may correspond to the controller 130 in the memory system 110 of FIGS. 1 and 5, and the memory device 6340 may correspond to the memory device 150 in the memory system of FIGS. 1 and 5.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 10 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 and 5 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 13:
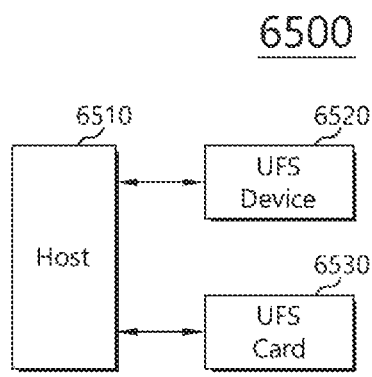

FIG. 12 is a diagram schematically illustrating another example of the data processing system including the memory system in accordance with an embodiment. FIG. 13 schematically illustrates an embedded Multi-Media Card (eMMC) including the memory system 110.

Referring to FIG. 12, the eMMC 6400 may include a controller 6430 and a memory device 6440 embodied by one or more NAND flash memories. The controller 6430 may correspond to the controller 130 in the memory system 110 of FIGS. 1 and 5, and the memory device 6440 may correspond to the memory device 150 in the memory system 110 of FIGS. 1 and 5.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 13 to 16 are diagrams schematically illustrating other examples of the data processing system including the memory system in accordance with various embodiments. Specifically, FIGS. 14 to 17 schematically illustrate Universal Flash Storage (UFS) systems including the memory system 110.

Referring to FIGS. 13 to 16, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIGS. 1 and 5. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 10 to 12, and the UFS cards 6530, 6630, 6730 and 6830 may be embodied in the form of the memory card system 6100 described with reference to FIG. 9.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI Unified Protocol (UniPro) in Mobile Industry Processor Interface (MIPI). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

In the UFS system 6500 illustrated in FIG. 13, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. The configuration in which one UFS device 6520 and one UFS card 6530 are connected to the host 6510 is only an example. A plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 14:
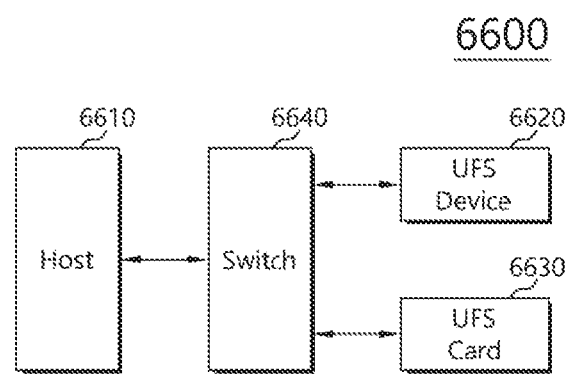

In the UFS system 6600 illustrated in FIG. 14, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. The configuration in which one UFS device 6620 and one UFS card 6630 are connected to the switching module 6640 is only an example. A plurality of UFS devices and UFS cards may be connected in parallel or in the form of a star to the switching module 6640, and a plurality of UFS cards may be connected in series or in the form of a chain to the UFS device 6620.

Figure 15:
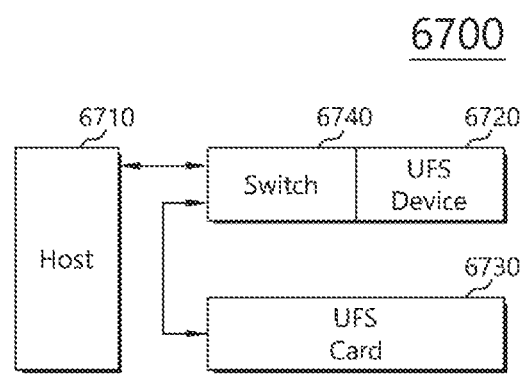

In the UFS system 6700 illustrated in FIG. 15, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro, and the switching module 6740 may be integrated as one module with the UFS device 6720 inside or outside the UFS device 6720. The configuration in which one UFS device 6720 and one UFS card 6730 are connected to the switching module 6740 is only an example. A plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 16:
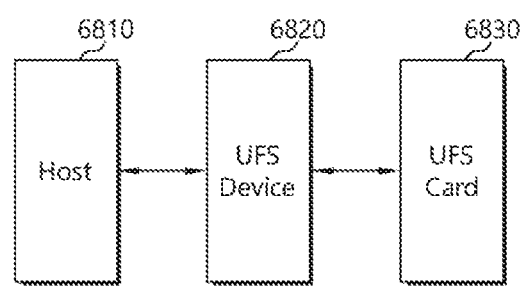

In the UFS system 6800 illustrated in FIG. 16, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. The configuration in which one UFS device 6820 is connected to the host 6810 and one UFS card 6830 is connected to the UFS device 6820 is only an example. A plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 17:
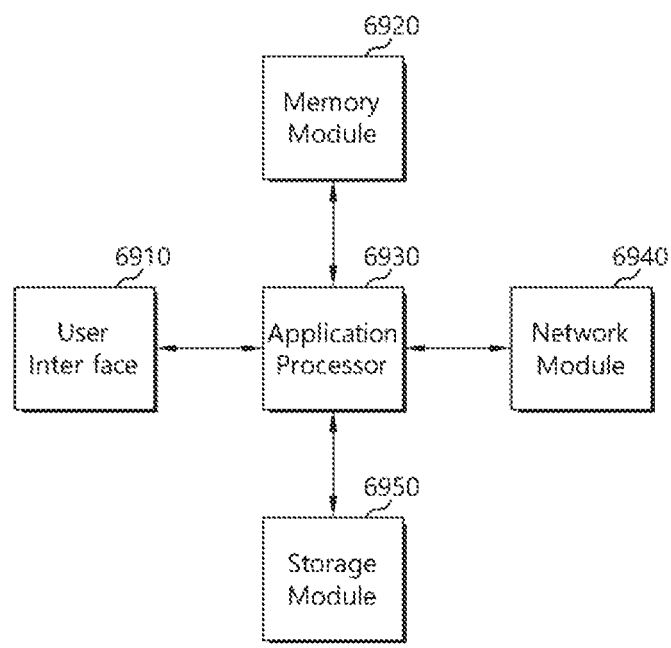
Figure 18:
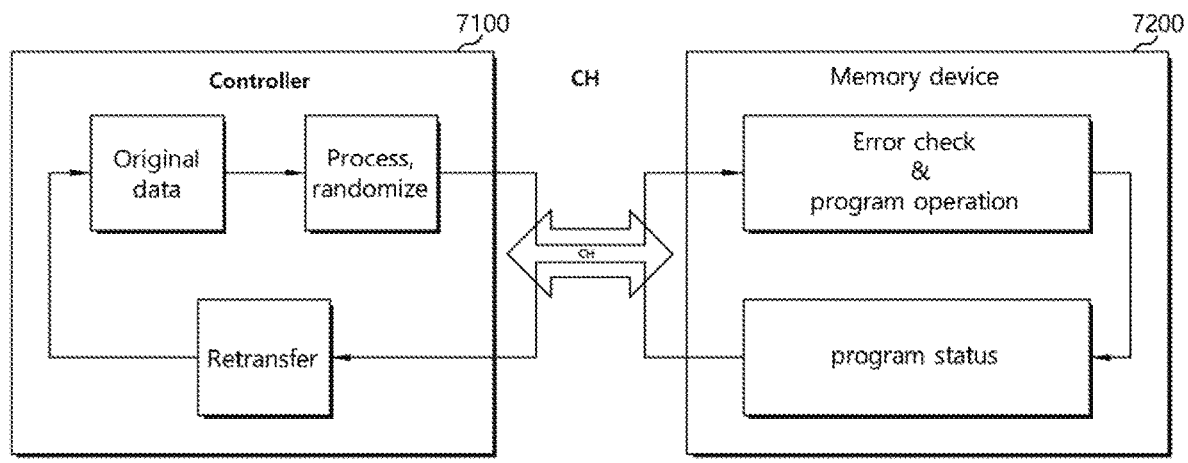
FIG. 18 illustrates a memory system in accordance with an embodiment of the present invention.

FIG. 17 is a diagram schematically illustrating another example of the data processing system including a memory system in accordance with an embodiment. FIG. 18 is a diagram schematically illustrating a user system including the memory system 110.

Referring to FIG. 17, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR2 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 and 5. Furthermore, the storage module 6950 may be embodied as an SSD, eMMC and UFS as described above with reference to FIGS. 11 to 16.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 and 5 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

The memory system and the operating method thereof according to the embodiments may reduce performance deterioration of the memory system, and maximize use efficiency of a memory device.

FIG. 18 illustrates a memory system 7000 in accordance with an embodiment.

Referring to FIG. 18, the memory system 7000 may include a controller 7100 for controlling a program operation of the memory system 7000, a memory device 7200 for performing a program operation to store data, and a channel for coupling the controller 7100 and the memory device 7200. Since the configurations of the controller 7100 and the memory device 7200 have been described above in detail, the following descriptions will be focused on the operations of the controller 7100 and the memory device 7200.

The controller 7100 may transfer original data as first data to store in the memory device 7200. In a specific example, the controller 7100 may transfer data for performing a program operation through the channel, in order to store the original data in the memory device 7200.

In an embodiment, the controller 7100 may transfer the original data and a write command to the memory device 1200. The memory device 7200 may perform a program operation in response to the write command.

In an embodiment, the controller 7100 may process the original data and transfer the processed original data through the channel. Specifically, the controller 7100 may process the original data and transfer the processed original data through the channel, such that the memory device 7200 may check whether the data received through the channel are equal to the data transferred by the controller 7100 through the channel. For example, the controller 7100 may process the original data by adding check bits such as parity bits, cyclic redundancy check (CRC) bits or hash code bits to the original data, and transfer the processed original data through the channel. Although the memory device 7200 does not directly compare the data received through the channel with the data transferred by the controller 7100 through the channel, the memory device 7200 may check the check bits of the data received through the channel, thereby indirectly checking whether the data received through the channel are equal to the data transferred by the controller 7100 through the channel. That is, the memory device 7200 may perform an error check operation to check the check bits of the data received through the channel, and determine that the data received through the channel are equal to the data transferred by the controller 7100 through the channel, when no error is checked.

In an embodiment, the controller 7100 may transfer randomized data through the channel. Specifically, the controller 7100 may randomize the original data or the processed original data and transfer the randomized data through the channel, such that the memory device 7200 can check whether the data received through the channel are equal to the data transferred by the controller 7100 through the channel. Although the memory device 7200 does not directly compare the data received through the channel with the data transferred by the controller 7100 through the channel, the memory device 7200 may check whether the data received through the channel are randomized, thereby indirectly checking whether the data received through the channel are equal to the data transferred by the controller 7100 through the channel.

Then, the memory device 7200 may perform an error check operation and a program operation. Specifically, the memory device 7200 may perform the error check operation to check whether the data as second data received through the channel are equal to the data transferred by the controller 7100 through the channel. This is in order to check whether an output of the controller 7100 is transferred to the memory device 7200 without an error, when data are exchanged between the controller 7100 and the memory device 7200. The memory device 7200 may perform the program operation to store the data received through the channel.

In an embodiment, the memory device 7200 may perform the error check operation and the program operation at the same time. Alternatively, the memory device 7200 may perform the error check operation before/after the program operation. In other words, the memory device 7200 may perform the error check operation and the program operation at different times.

In an embodiment, the memory device 7200 may complete the error check operation before the program operation is completed. This is in order to minimize delay caused by the error check operation, and to stop an unnecessary program operation when an error occurred.

In an embodiment, the memory device 7200 may perform the error check operation on a data size the same as that on which the program operation is performed. In a specific example, when the program operation is performed on a page basis, the memory device 7200 may perform the error check operation on a page basis.

In an embodiment, the memory device 7200 may stop the program operation. Specifically, while a program operation is performed, the memory device 7200 may stop the program operation, when an error check operation on all or part of the data received through the channel is completed and an error is checked in all or part of the received data. The memory device 7200 may generate a signal indicating a program operation fail, and transfer the signal to the controller 7100.

In an embodiment, the memory device 7200 may perform the error check operation based on the check bits. Specifically, when the check bits such as parity bits, CRC bits and hash code bits are included in the data received through the channel, the memory device 7200 may perform an error check operation to check the check bits. Further, based on the result of the error check operation, the memory device 7200 may determine whether the data received through the channel are equal to the data transferred by the controller 7100 through the channel. When the result of the error check operation indicates no error, the memory device 7200 may determine that the data received through the channel are equal to the data transferred by the controller 7100 through the channel. On the other hand, when the result of the error check operation indicates an error, the memory device 7200 may determine that the data received through the channel are not equal to the data transferred by the controller 7100 through the channel.

In an embodiment, the memory device 7200 may perform the error check operation based on the randomization. Specifically, when the controller 7100 randomizes the original data or the processed original data and transfers the randomized data through the channel, the memory device 7200 may perform the error check operation to check whether the randomized data received through the channel are equal to the data transferred by the controller 7100 through the channel. When the result of the error check operation indicates that the ratio of 0's to 1's in the received data of the memory device 7200 is equal to the ratio of 0's to 1's in the transmitted data of the controller 7100, the memory device 7200 may determine that the data received through the channel are equal to the data transferred by the controller 7100 through the channel. On the other hand, when the result of the error check operation indicates that the ratio of 0's to 1's in the received data of the memory device 7200 is not equal to the ratio of 0's to in the transmitted data of the controller 7100, the memory device 7200 may determine that the data received through the channel are not equal to the data transferred by the controller 7100 through the channel.

The memory device 7200 may transfer the results of the error check operation and the program operation to the controller 7100. In a specific example, the memory device 7200 may transfer result information to the controller 7100. The result information may indicate whether data received as the result of the error check operation are equal to the data transferred by the controller 7100 through the channel.

Furthermore, the memory device 7200 may transfer result information to the controller 7100. The result information may indicate the result of the program operation, i.e. whether the program operation has been completed or whether the program operation was stopped according to the result of the error check operation.

Then, the controller 7100 may retransfer data based on the result of the error check operation. Specifically, when the result of the error check operation indicates that the data transferred through the channel are not equal to the data received by the memory device 7200 through the channel, the controller 7100 may retransfer the data for performing the program operation through the channel. In this case, the controller 7100 may stop the program operation of the memory device 7200. However, when the result of the error check operation indicates no error, the controller 7100 may determine that the program operation for the corresponding data was normally performed.

Figure 19:
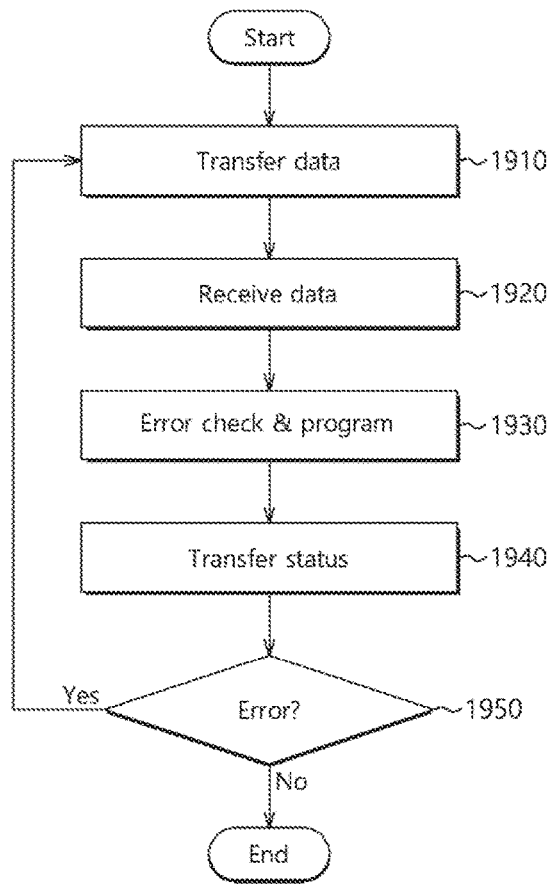
FIG. 19 is a flowchart illustrating an operating method of a memory system in accordance with an embodiment of the present invention.

FIG. 19 is a flowchart illustrating an operating method of a memory system in accordance with an embodiment.

The operating method of FIG. 19 may be performed by the memory system 100 including the controller 130 and the memory device 150, illustrated in FIG. 1.

At step 1910, data may be transferred. Specifically, the controller 130 may transfer original data to the memory device 150 through the channel, in order to store the original data in the memory device 150.

In an embodiment, the controller 130 may transfer the original data and a write command to the memory device 150 through the channel. Then, the memory device 150 may perform a program operation in response to the write command.

In an embodiment, the controller 130 may process the original data and transfer the processed original data through the channel. Specifically, the controller 130 may process the original data and transfer the processed original data through the channel, such that the memory device 150 can check whether the data received through the channel are equal to the data transferred by the controller 7100 through the channel. For example, the controller 130 may process the original data by adding check bits such as parity bits, CRC bits or hash code bits to the original data, and transfer the processed original data through the channel. Although the memory device 150 does not directly compare the data received through the channel with the data transferred by the controller 130 through the channel, the memory device 150 may check the check bits of the data received through the channel, thereby indirectly checking whether the data received through the channel are equal to the data transferred by the controller 130 through the channel. That is, the memory device 150 may perform an error check operation to check the check bits of the data received through the channel, and determine that the data received through the channel are equal to the data transferred by the controller 130 through the channel, when no error is checked.

In an embodiment, the controller 130 may transfer randomized data through the channel. Specifically, the controller 130 may randomize the original data or the processed original data and transfer the randomized data through the channel, such that the memory device 150 can determine whether the data received through the channel are equal to the data transferred by the controller 130 through the channel. Although the memory device 150 does not directly compare the data received through the channel with the data transferred by the controller 130 through the channel, the memory device 150 may check whether the data received through the channel are randomized, thereby indirectly checking whether the data received through the channel are equal to the data transferred by the controller 10 through the channel.

At step 1920, the data may be received. Specifically, the memory device 150 may receive the data transferred by the controller 130 through the channel.

At step 1930, an error check operation and a program operation may be performed. Specifically, the memory device 150 may perform the error check operation to check whether the data received through the channel are equal to the data transferred by the controller 130 through the channel. This is done to check whether an output of the controller 130 is transferred to the memory device 150 without an error, when data are transmitted/received between the controller 130 and the memory device 150. The memory device 150 may perform the program operation to store the data received through the channel.

In an embodiment, the memory device 150 may perform the error check operation and the program operation at the same time. Alternatively, the memory device 150 may perform the error check operation before/after the program operation.

In an embodiment, the memory device 150 may complete the error check operation before the program operation is completed. This is in order to minimize delay caused by the error check operation, and to stop an unnecessary program operation when an error occurred.

In an embodiment, the memory device 150 may perform the error check operation on a data size basis by which the program operation is performed. In a specific example, when the program operation is performed on a page basis, the memory device 150 may perform the error check operation on a page basis.

In an embodiment, the memory device 150 may stop the program operation. Specifically, while a program operation is performed, the memory device 150 may stop the program operation, when the error check operation for all or part of the data received through the channel is completed and an error is checked in all or part of the received data. When an error is identified, the memory device 150 may generate a signal indicating a program operation fail, and transfer the signal to the controller 130.

In an embodiment, the memory device 150 may perform the error check operation based on the check bits. Specifically, when the check bits such as parity bits, CRC bits and hash code bits are included in the data received through the channel, the memory device 150 may perform the error check operation to check the check bits. Further, based on the result of the error check operation, the memory device 150 may determine whether the data received through the channel are equal to the data transferred by the controller 130 through the channel. When the result of the error check operation indicates no error, the memory device 150 may determine that the data received through the channel are equal to the data transferred by the controller 130 through the channel. On the other hand, when the result of the error check operation indicates that an error, the memory device 150 may determine that the data received through the channel are not equal to the data transferred by the controller 130 through the channel.

In an embodiment, the memory device 150 may perform the error check operation based on the randomization. Specifically, when the controller 130 randomizes the original data or the processed original data and transfers the randomized data through the channel, the memory device 150 may perform the error check operation to check whether the randomized data received through the channel are equal to the data transferred by the controller 130 through the channel. When the result of the error check operation indicates that the ratio of 0's to 1's in the received data of the memory device 150 is equal to the ratio of 0's to 1's in the transmitted data of the controller 130, the memory device 150 may determine that the data received through the channel are equal to the data transferred by the controller 130 through the channel. On the other hand, when the result of the error check operation indicates that the ratio of 0's to 1's in the received data of the memory device 150 is not equal to the ratio of 0's to in the transmitted data of the controller, the memory device 150 may determine that the data received through the channel are not equal to the data transferred by the controller 130 through the channel.

At step 1940, a status of the memory device 150 may be transferred to the controller 130. Specifically, the memory device 150 may transfer the status information indicating the results of the error check operation and the program operation to the controller 130.

At step 1950, whether to retransfer data may be decided. Specifically, the controller 130 may decide whether to retransfer the data to store in the memory device 150, based on the result of the error check operation, contained in the received status information. For example, when the result of the error check operation indicates an error or the data transferred through the channel are not equal to the data received by the memory device 150 through the channel, the controller 130 may retransfer the data for performing the program operation through the channel. That is, step 1910 may be performed. When an error is found while the memory device 150 is performing a program operation, the controller 130 may stop the program operation of the memory device 150. However, when the result of the error check operation indicates no error, the controller 130 may determine that the program operation for the corresponding data was normally performed.

Although the present invention has been described with reference to various specific embodiments, it will be apparent to those skilled in the art to which the present invention pertains in light of this disclosure that various modifications may be made without departing from the spirit and scope of the invention as defined in the following claims.

What is claimed is:

1. An operating method of a memory system, comprising the steps of:
    transferring, by a controller, data for a program operation;
    performing, by a nonvolatile memory device, an error check operation to determine whether data received from the controller includes an error; and
    performing, by the nonvolatile memory device, the program operation to store the data.

2. The operating method of claim 1, wherein the controller transfers the data to the nonvolatile memory device through a channel.

3. The operating method of claim 1, wherein the performing of the error check operation is completed before the performing of the program operation is completed.

4. The operating method of claim 1, further comprising retransferring, by the controller, the data through a channel, when the result of the error check operation indicates that the data includes an error.

5. The operating method of claim 1, wherein the performing of the program operation comprises stopping the program operation before the program operation is completed, when the result of the error check operation indicates that the data includes an error.

6. The operating method of claim 1, wherein the performing of the error check operation comprises performing the error check operation on a data size the same as that on which the program operation is performed.

7. The operating method of claim 1, wherein the performing of the error check operation comprises performing the error check operation to check at least one of parity bits, cyclic redundancy check (CRC) bits and hash code bits for the data.

8. The operating method of claim 1, wherein the transferring of the data comprises transferring the randomized data through a channel.

9. The operating method of claim 8, wherein the performing of the error check operation comprises checking the ratio of 0's to 1's in the cells on a data size basis by which the program operation is performed.

10. The operating method of claim 8, wherein the performing of the error check operation comprises checking the ratio of 0's to 1's in the cells in which data are stored during the program operation, based on a current applied to the cells.

11. A memory system comprising:
    a controller configured to transfer data for a program operation; and
    a memory device configured to perform an error check operation for determining whether the data received from the controller includes an error while performing the program operation for storing the data,
    wherein the error check operation and the program operation are performed to be at least partially overlapped.

12. The memory system of claim 11, wherein the controller transfers the data to the memory device through a channel.

13. The memory system of claim 11, wherein the memory device completes the error check operation before the program operation is completed.

14. The memory system of claim 11, wherein, when the result of the error check operation indicates that the data includes an error, the controller retransfers the data.

15. The memory system of claim 11, wherein the memory device stops the program operation before the program operation is completed, when the result of the error check operation indicates that the data includes an error.

16. The memory system of claim 11, wherein the memory device performs the error check operation on a data size basis the same as that on which the program operation is performed.

17. The memory system of claim 11, wherein the memory device performs the error check operation to check at least one of parity bits, cyclic redundancy check (CRC) bits and hash code bits for the data.

18. The memory system of claim 11, wherein the controller transfers the data which is randomized through a channel.

19. The memory system of claim 18, wherein the memory device performs the error check operation to check the ratio of 0's to 1's in cells on which the program operation for the data has been performed.

20. The memory system of claim 18, wherein the memory device checks the ratio of 0's to 1's in the cells in which data are stored during the program operation, based on a current applied to the cells.

* * * * *